United States Patent
Platzgummer et al.

(10) Patent No.: US 10,651,010 B2
(45) Date of Patent: May 12, 2020

(54) NON-LINEAR DOSE- AND BLUR-DEPENDENT EDGE PLACEMENT CORRECTION

(71) Applicant: IMS Nanofabrication GmbH, Vienna (AT)

(72) Inventors: Elmar Platzgummer, Vienna (AT); Christoph Spengler, Vienna (AT); Wolf Naetar, Vienna (AT)

(73) Assignee: IMS Nanofabrication GmbH, Vienna (AT)

( * ) Notice: Subject to any disclaimer, the term of this patent is extended or adjusted under 35 U.S.C. 154(b) by 0 days.

(21) Appl. No.: 16/239,061

(22) Filed: Jan. 3, 2019

(65) Prior Publication Data

US 2019/0214226 A1 Jul. 11, 2019

Related U.S. Application Data

(60) Provisional application No. 62/615,386, filed on Jan. 9, 2018.

(51) Int. Cl.
*H01J 37/302* (2006.01)
*H01J 37/317* (2006.01)

(52) U.S. Cl.
CPC ...... *H01J 37/3026* (2013.01); *H01J 37/3174* (2013.01)

(58) Field of Classification Search
CPC ............... H01J 37/3026; H01J 37/3174; H01J 37/3177; H01J 2237/31769
See application file for complete search history.

(56) References Cited

U.S. PATENT DOCUMENTS

| 1,033,741 A | 7/1912 | Sims |
| 1,420,104 A | 6/1922 | Howe et al. |

(Continued)

FOREIGN PATENT DOCUMENTS

| CN | 202204836 U | 4/2012 |
| EP | 0178156 A2 | 4/1986 |

(Continued)

OTHER PUBLICATIONS

European Search Report for Application 08450077.6, report dated Jan. 29, 2010, 2 pgs.

(Continued)

*Primary Examiner* — Brooke Purinton
(74) *Attorney, Agent, or Firm* — KPPB LLP

(57) ABSTRACT

A rasterized exposure method implementing a position correction for edge positions to correct for a non-linear relationship between the position of a feature edge (dCD) of a pattern element boundary and the nominal position of the boundary as expressed through the dose of exposure (d) of the edge pixel is provided. The position correction includes: determining a position value of the edge position, determining a corrected position value based on the position value using a predefined non linear function, and modifying the pattern to effectively shift the pattern element boundary in accordance with the corrected position value. The non linear function describes the inverse of the relationship between a nominal position value (d), which is used as input value during exposure of the pattern, and a resulting position (dCD) of the pattern element boundary generated when exposed with the nominal position value.

10 Claims, 21 Drawing Sheets

(56) References Cited

U.S. PATENT DOCUMENTS

| | | |
|---|---|---|
| 1,903,005 A | 3/1933 | McCuen |
| 2,187,427 A | 1/1940 | Middleton |
| 2,820,109 A | 1/1958 | Dewitz |
| 2,920,104 A | 1/1960 | Brooks et al. |
| 3,949,265 A | 4/1976 | Holl |
| 4,467,211 A | 8/1984 | Smith |
| 4,735,881 A | 4/1988 | Kobayashi et al. |
| 4,899,060 A | 2/1990 | Lischke |
| 5,103,101 A | 4/1992 | Berglund et al. |
| 5,189,306 A | 2/1993 | Frei |
| 5,260,579 A | 11/1993 | Yasuda et al. |
| 5,369,282 A | 11/1994 | Arai et al. |
| 5,393,987 A | 2/1995 | Abboud et al. |
| 5,399,872 A | 3/1995 | Yasuda et al. |
| 5,533,170 A | 7/1996 | Teitzel et al. |
| 5,814,423 A | 9/1998 | Maruyama et al. |
| 5,841,145 A | 11/1998 | Satoh et al. |
| 5,847,959 A | 12/1998 | Veneklasen et al. |
| 5,857,815 A | 1/1999 | Bailey et al. |
| 5,866,300 A | 2/1999 | Satoh et al. |
| 5,876,902 A | 3/1999 | Veneklasen |
| 5,933,211 A | 8/1999 | Nakasugi et al. |
| 6,014,200 A | 1/2000 | Sogard et al. |
| 6,043,496 A | 3/2000 | Tennant |
| 6,049,085 A | 4/2000 | Ema |
| 6,107,636 A | 8/2000 | Muraki |
| 6,111,932 A | 8/2000 | Dinsmore |
| 6,137,113 A | 10/2000 | Muraki |
| 6,225,637 B1 | 5/2001 | Terashima et al. |
| 6,229,595 B1 | 5/2001 | McKinley |
| 6,252,339 B1 | 6/2001 | Kendall |
| 6,258,511 B1 | 7/2001 | Okino et al. |
| 6,280,798 B1 | 8/2001 | Ring et al. |
| 6,333,138 B1 | 12/2001 | Higashikawa et al. |
| 6,472,673 B1 | 10/2002 | Chalupka et al. |
| 6,473,237 B2 | 10/2002 | Mei |
| 6,552,353 B1 | 4/2003 | Muraki et al. |
| 6,617,587 B2 | 9/2003 | Parker |
| 6,768,123 B2 | 7/2004 | Giering |
| 6,768,125 B2 | 7/2004 | Platzgummer et al. |
| 6,829,054 B2 | 12/2004 | Stanke et al. |
| 6,835,937 B1 | 12/2004 | Muraki et al. |
| 6,858,118 B2 | 2/2005 | Platzgummer et al. |
| 6,897,454 B2 | 5/2005 | Sasaki et al. |
| 6,965,153 B1 | 11/2005 | Ono et al. |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,199,373 B2 | 4/2007 | Stengl et al. |
| 7,201,213 B2 | 4/2007 | Leeson |
| 7,214,951 B2 | 5/2007 | Stengl et al. |
| 7,276,714 B2 | 10/2007 | Platzgummer et al. |
| 7,367,738 B2 | 5/2008 | Cleveland |
| 7,368,738 B2 | 5/2008 | Platzgummer et al. |
| 7,446,601 B2 | 11/2008 | LeChevalier |
| 7,459,247 B2 | 12/2008 | Bijnen et al. |
| 7,671,687 B2 | 3/2010 | LeChevalier |
| 7,683,551 B2 | 3/2010 | Miyamoto et al. |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,741,620 B2 | 6/2010 | Doering et al. |
| 7,772,574 B2 | 8/2010 | Stengl et al. |
| 7,777,201 B2 | 8/2010 | Fragner et al. |
| 7,781,748 B2 | 8/2010 | Platzgummer et al. |
| 7,823,081 B2 | 10/2010 | Sato et al. |
| 8,057,972 B2 | 11/2011 | Heinrich et al. |
| 8,115,183 B2 | 2/2012 | Platzgummer et al. |
| 8,178,856 B2 | 5/2012 | Nakayamada et al. |
| 8,183,543 B2 | 5/2012 | Platzgummer et al. |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,257,888 B2 | 9/2012 | Sczyrba et al. |
| 8,258,488 B2 | 9/2012 | Platzgummer et al. |
| 8,294,117 B2 | 10/2012 | Kruit et al. |
| 8,304,749 B2 | 11/2012 | Platzgummer et al. |
| 8,378,320 B2 | 2/2013 | Platzgummer |
| 8,502,174 B2 | 8/2013 | Wieland |
| 8,531,648 B2 | 9/2013 | Jager et al. |
| 8,546,767 B2 | 10/2013 | Platzgummer et al. |
| 8,563,942 B2 | 10/2013 | Platzgummer |
| 8,598,544 B2 | 12/2013 | Van De Peut et al. |
| 8,736,170 B1 | 5/2014 | Liu et al. |
| 8,859,983 B2 | 10/2014 | Wieland |
| 9,053,906 B2 | 6/2015 | Platzgummer |
| 9,093,201 B2 | 7/2015 | Platzgummer et al. |
| 9,099,277 B2 | 8/2015 | Platzgummer |
| 9,184,026 B2 | 11/2015 | Wieland |
| 9,188,874 B1 | 11/2015 | Johnson |
| 9,269,543 B2 | 2/2016 | Reiter et al. |
| 9,335,638 B2 | 5/2016 | Jager et al. |
| 9,373,482 B2 | 6/2016 | Platzgummer |
| 9,443,699 B2 | 9/2016 | Platzgummer et al. |
| 9,495,499 B2 | 11/2016 | Platzgummer et al. |
| 9,520,268 B2 | 12/2016 | Platzgummer |
| 9,568,907 B2 | 2/2017 | Platzgummer et al. |
| 9,653,263 B2 | 5/2017 | Platzgummer et al. |
| 9,691,589 B2 | 6/2017 | Van De Peut et al. |
| 9,799,487 B2 | 10/2017 | Platzgummer |
| 9,978,562 B2 | 5/2018 | Van De Peut et al. |
| 10,325,756 B2 | 6/2019 | Platzgummer |
| 10,325,757 B2 | 6/2019 | Platzgummer et al. |
| 10,410,831 B2 | 9/2019 | Platzgummer |
| 10,522,329 B2 | 12/2019 | Platzgummer et al. |
| 2001/0028038 A1 | 10/2001 | Hamaguchi et al. |
| 2002/0021426 A1 | 2/2002 | Mei et al. |
| 2002/0036264 A1 | 3/2002 | Nakasuji et al. |
| 2002/0148978 A1 | 10/2002 | Innes et al. |
| 2003/0085360 A1 | 5/2003 | Parker et al. |
| 2003/0106230 A1 | 6/2003 | Hennessey |
| 2003/0155534 A1 | 8/2003 | Platzgummer et al. |
| 2003/0160980 A1 | 8/2003 | Olsson et al. |
| 2004/0058536 A1 | 3/2004 | Ki |
| 2004/0119021 A1 | 6/2004 | Parker et al. |
| 2004/0157407 A1 | 8/2004 | Qin-Yi et al. |
| 2004/0169147 A1 | 9/2004 | Ono et al. |
| 2005/0001178 A1 | 1/2005 | Parker et al. |
| 2005/0063510 A1 | 3/2005 | Hieronimi et al. |
| 2005/0072941 A1 | 4/2005 | Tanimoto et al. |
| 2005/0104013 A1 | 5/2005 | Stengl et al. |
| 2005/0242302 A1 | 11/2005 | Platzgummer et al. |
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer et al. |
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0212052 A1 | 9/2008 | Wagner et al. |
| 2008/0237460 A1 | 10/2008 | Fragner et al. |
| 2008/0257096 A1 | 10/2008 | Zhu et al. |
| 2008/0260283 A1 | 10/2008 | Ivansen |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0168043 A1 | 7/2009 | Lee |
| 2009/0200495 A1 | 8/2009 | Platzgummer et al. |
| 2009/0249266 A1 | 10/2009 | Pierrat et al. |
| 2009/0256075 A1 | 10/2009 | Kemen et al. |
| 2009/0321631 A1 | 12/2009 | Smick et al. |
| 2010/0124722 A1 | 5/2010 | Fragner et al. |
| 2010/0127185 A1 | 5/2010 | Fragner et al. |
| 2010/0127431 A1 | 5/2010 | Sandstrom |
| 2010/0178602 A1 | 7/2010 | Seto et al. |

(56) References Cited

U.S. PATENT DOCUMENTS

| | | |
|---|---|---|
| 2010/0187434 A1 | 7/2010 | Platzgummer et al. |
| 2010/0288938 A1 | 11/2010 | Platzgummer |
| 2011/0053087 A1 | 3/2011 | Nielsen et al. |
| 2011/0073782 A1 | 3/2011 | Wieland |
| 2011/0084219 A1 | 4/2011 | Adamec et al. |
| 2011/0121208 A1 | 5/2011 | Nakayamada et al. |
| 2011/0204253 A1 | 8/2011 | Platzgummer et al. |
| 2011/0226968 A1 | 9/2011 | Platzgummer |
| 2012/0001097 A1 | 1/2012 | Yashima et al. |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0151428 A1 | 6/2012 | Tanaka et al. |
| 2012/0211674 A1 | 8/2012 | Kato |
| 2012/0286169 A1 | 11/2012 | Van de Peut et al. |
| 2012/0286170 A1 | 11/2012 | Van de Peut et al. |
| 2012/0288787 A1 | 11/2012 | Choi et al. |
| 2012/0329289 A1 | 12/2012 | Fujimura et al. |
| 2013/0070222 A1 | 3/2013 | Fujimura |
| 2013/0120724 A1 | 5/2013 | Wieland et al. |
| 2013/0128247 A1 | 5/2013 | Khuat Duy et al. |
| 2013/0157198 A1 | 6/2013 | Yoshikawa et al. |
| 2013/0161511 A1 | 6/2013 | Karimata et al. |
| 2013/0164684 A1 | 6/2013 | Yamanaka |
| 2013/0198697 A1 | 8/2013 | Hotzel et al. |
| 2013/0201468 A1 | 8/2013 | Manakli |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0158916 A1 | 6/2014 | Fujimura |
| 2014/0197327 A1 | 7/2014 | Platzgummer |
| 2014/0240732 A1 | 8/2014 | Tinnemans et al. |
| 2014/0264066 A1 | 9/2014 | Van De Peut et al. |
| 2014/0264086 A1 | 9/2014 | Van De Peut et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada |
| 2015/0248993 A1 | 9/2015 | Reiter et al. |
| 2015/0311030 A1 | 10/2015 | Platzgummer et al. |
| 2015/0311031 A1 | 10/2015 | Platzgummer et al. |
| 2015/0347660 A1 | 12/2015 | Platzgummer et al. |
| 2016/0012170 A1 | 1/2016 | Platzgummer |
| 2016/0013019 A1 | 1/2016 | Platzgummer |
| 2016/0071684 A1 | 3/2016 | Platzgummer et al. |
| 2016/0276131 A1 | 9/2016 | Platzgummer |
| 2016/0276132 A1 | 9/2016 | Platzgummer et al. |
| 2016/0284509 A1 | 9/2016 | Matsumoto |
| 2016/0336147 A1 | 11/2016 | Platzgummer |
| 2016/0349626 A1 | 12/2016 | Matsumoto |
| 2017/0154750 A1 | 6/2017 | Sato |
| 2017/0357153 A1 | 12/2017 | Platzgummer |
| 2018/0218879 A1 | 8/2018 | Platzgummer et al. |
| 2019/0066976 A1 | 2/2019 | Platzgummer et al. |
| 2019/0088448 A1 | 3/2019 | Platzgummer et al. |

FOREIGN PATENT DOCUMENTS

| | | |
|---|---|---|
| EP | 0928012 A2 | 7/1999 |
| EP | 1033741 A2 | 9/2000 |
| EP | 1993118 A2 | 11/2008 |
| EP | 2019415 A1 | 1/2009 |
| EP | 2187427 A2 | 5/2010 |
| EP | 2190003 A2 | 5/2010 |
| EP | 2214194 A1 | 8/2010 |
| EP | 2312609 A1 | 4/2011 |
| EP | 2317535 A2 | 5/2011 |
| EP | 2363875 A1 | 9/2011 |
| EP | 2950325 A1 | 12/2015 |
| EP | 2993684 A1 | 3/2016 |
| EP | 3037878 A1 | 6/2016 |
| GB | 2349737 A | 11/2000 |
| JP | 08213301 A | 8/1996 |
| JP | 2006019436 A | 1/2006 |
| JP | 2006332289 | 12/2006 |
| JP | 2007172862 A | 7/2007 |
| JP | 2010098275 A | 4/2010 |
| WO | 2006084298 A1 | 8/2006 |
| WO | 2008053140 A1 | 5/2008 |
| WO | 2009147202 | 12/2009 |
| WO | 2012172913 A1 | 12/2012 |

OTHER PUBLICATIONS

European Search Report for Application 09450211.9-1226; report dated Sep. 15, 2010; 4 pgs.

European Search Report for application 09450212.7; dated Sep. 9, 2010, 9 pgs.

European Search Report for Application 141501197.7, report dated Jun. 6, 2014, 2 pgs.

European Search Report for Application 14165967, report dated Oct. 30, 2014, 2 pgs.

European Search Report for Application 14165970, report dated Jun. 18, 2014, 2 pgs.

European Search Report for Application 14170611, report dated Nov. 4, 2014, 3 pgs.

European Search Report for Application 14176563, report dated Jan. 14, 2015, 2 pgs.

European Search Report for Application 14177851; report dated Oct. 16, 2014; 1 page.

European Search Report for Application 14199183, report dated Jun. 19, 2015, 2 pgs.

European Search Report for Application 15159397.7, report dated Sep. 28, 2015, 7 pgs.

European Search Report for Application 15159617.8, report dated Oct. 19, 2015, 3 pgs.

European Search Report for Application 15164770, report dated Sep. 18, 2015; 2 pgs.

European Search Report for Application 15164772, report dated Sep. 11, 2015, 2 pgs.

European Search Report for Application 15169632, report dated Oct. 20, 2015, 3 pgs.

European Search Report for Application 15171348, report dated Oct. 30, 2015, 2 pgs.

European Search Report for EP 14176645, dated Dec. 1, 2014, 1 pg.

European Search Report for EP Application No. 16174185, Search Completed Dec. 6, 2016, 2 pgs.

European Search Report for European Application 10450070.7 dated May 7, 2012, 13 pgs.

European Search Report for European Application No. 16160622, Search completed Jul. 21, 2016, dated Jul. 21, 2016, 3 Pgs.

European Search Report for European Patent Application 16160621, Report Completed Oct. 5, 2016, 3 pgs.

Extended European Search Report for European Application No. 16169216.5, Search completed Sep. 21, 2016, dated Sep. 29, 2016, 12 Pgs.

Extended European Search Report for European Application No. 17153506, Search completed Oct. 5, 2017, dated Oct. 16, 2017, 2 Pgs.

Extended European Search Report for European Application No. 17187922.4, Search completed Feb. 21, 2018, dated Mar. 6, 2018, 7 Pgs.

Extended European Search Report for European Application No. 17191553.1, Search completed Mar. 22, 2018, dated Apr. 9, 2018, 5 Pgs.

Extended European Search Report for European Application No. 18150797.1, Search completed Jun. 29, 2018, dated Jul. 9, 2018, 8 Pgs.

Extended European Search Report for European Application No. 18154140.0, Search completed Aug. 16, 2018, dated Sep. 4, 2018, 5 Pgs.

"Dither", Wikipedia, Retrieved from https://en.wikipedia.org/w/index.php?title=Dither&oldid=762118152 on Oct. 5, 2017.

"Ordered dithering", Wikipedia, Retrieved from https://en.wikipedia.org/w/index.php?title=Ordered_dithering&oldid=759840417 on Oct. 5, 2017.

(56) References Cited

OTHER PUBLICATIONS

Berry et al., "Programmable aperture plate for maskless high-throughput nanolithography", J. Vac. Sci. Technol., Nov./Dec. 1997, vol. B15, No. 6, pp. 2382-2386.

Borodovsky, "EUV, EBDW—ARF Replacement or Extension?", KLA-Tencor Lithography User Forum, Feb. 21, 2010, San Jose, CA, USA, 21 pgs.

Borodovsky, "MPProcessing for MPProcessors", SEMATECH Maskless Lithography and Multibeam Mask Writer Workshop, May 10, 2010, New York, NY, USA, 35 pgs.

Disclosed Anonymously, "Multi-tone rasterization, dual pass scan, data path and cell based vector format", IPCOM000183472D, printed from ip.com PriorArtDatabase, published May 22, 2009, 108 pages.

Hinterberger, "Ion optics with electrostatic lenses", University of Bonn, Germany, 2006, 18 pgs.

Huber et al., "Computing Straight Skeletons and Motorcycle Graphs: Theory and Practice", Thesis, Univ. of Salzburg (Austria) Jun. 2011, 134 pgs.

Kapl et al., "Characterization of CMOS programmable multi-beam blanking arrays as used for programmable multi-beam projection lithography and resistless nanopatterning", Journal of Micromechanics and Microengineering, vol. 21, Mar. 24, 2011, pp. 1-8.

Kim et al., "Binary-encounter-dipole model for electron-impact ionization", Phys. Rev. A, Nov. 1994, vol. 50, No. 3, pp. 3954-3967.

Li et al., "Through-Silicon Interposer Technology for Heterogeneous Integration", Future Fab Intl., Issue 45 (Apr. 25, 2013), 6 pgs.

Palfrader et al., "Computing Mitered Offset Curves Based on Straight Skeletons", Computer-Aided Design & Applications, vol. 12, No. 4, Feb. 11, 2015, pp. 414-424.

Paraskevopoulos et al., "Scalable (24—140 Gbps) optical data link, well adapted for future maskless lithography applications", Proc. SPIE vol. 7271, 72711 I (2009), 11 pgs.

Platzgummer et al., "eMET—50keV electron Mask Exposure Tool Development based on proven multi-beam projection technology", Proc. of SPIE, 2010, vol. 7823, pp. 782308-1-782308-12.

Platzgummer et al., "eMET POC: Realization of a proof-of-concept 50 keV electron multibeam Mask Exposure Tool", Proc. of SPIE, 2011, vol. 8166, pp. 816622-1-816622-7.

Shih, "Image processing and mathematical morphology: fundamentals and applications", CRC Press, 2009, pp. 26-32.

Vink et al., "Materials with a high secondary-electron yield for use in plasma displays", Applied Physics Letters, Mar. 25, 2002, vol. 80, No. 12, pp. 2216-2218.

Wheeler et al., "Use of Electron Beams in VLSI", G.E.C.Journal of Science and Technology, General Electric Company. Wembley, Middlesex, GB, vol. 48, No. 2, Jan. 1, 1982 (Jan. 1, 1982), pp. 103-107, XP000820522.

Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.

1-sigma blur [nm]

| dose factor 1 | 4 | 5 | 6 | 7 |
|---|---|---|---|---|
| 0 | 0 | 0 | 0 | 0 |
| 0.1 | 0.102 | 0.091 | 0.089 | 0.089 |
| 0.2 | 0.206 | 0.189 | 0.184 | 0.184 |
| 0.3 | 0.308 | 0.291 | 0.286 | 0.285 |
| 0.4 | 0.405 | 0.395 | 0.392 | 0.392 |
| 0.5 | 0.5 | 0.5 | 0.5 | 0.5 |
| 0.6 | 0.596 | 0.606 | 0.609 | 0.609 |
| 0.7 | 0.693 | 0.71 | 0.715 | 0.716 |
| 0.8 | 0.795 | 0.812 | 0.817 | 0.817 |
| 0.9 | 0.899 | 0.91 | 0.912 | 0.912 |

(d | dx/ps)

1-sigma blur [nm]

| dose factor 2 | 4 | 5 | 6 | 7 |
|---|---|---|---|---|
| 0 | 0 | 0 | 0 | 0 |
| 0.1 | 0.097 | 0.109 | 0.116 | 0.119 |
| 0.2 | 0.2 | 0.225 | 0.236 | 0.24 |
| 0.3 | 0.313 | 0.345 | 0.359 | 0.362 |
| 0.4 | 0.439 | 0.469 | 0.479 | 0.48 |
| 0.5 | 0.575 | 0.589 | 0.593 | 0.591 |
| 0.6 | 0.701 | 0.698 | 0.696 | 0.692 |
| 0.7 | 0.804 | 0.793 | 0.788 | 0.783 |
| 0.8 | 0.884 | 0.874 | 0.869 | 0.864 |
| 0.9 | 0.948 | 0.942 | 0.939 | 0.936 |

(d | dx/ps)

1-sigma blur [nm]

| dose factor 3 | 4 | 5 | 6 | 7 |
|---|---|---|---|---|
| 0 | 0 | 0 | 0 | 0 |
| 0.1 | 0.113 | 0.128 | 0.135 | 0.137 |
| 0.2 | 0.244 | 0.265 | 0.273 | 0.274 |
| 0.3 | 0.398 | 0.408 | 0.41 | 0.406 |
| 0.4 | 0.557 | 0.543 | 0.535 | 0.527 |
| 0.5 | 0.687 | 0.66 | 0.646 | 0.635 |
| 0.6 | 0.784 | 0.757 | 0.741 | 0.729 |
| 0.7 | 0.857 | 0.835 | 0.821 | 0.811 |
| 0.8 | 0.914 | 0.899 | 0.89 | 0.882 |
| 0.9 | 0.961 | 0.954 | 0.948 | 0.945 |

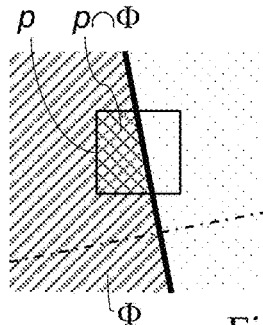 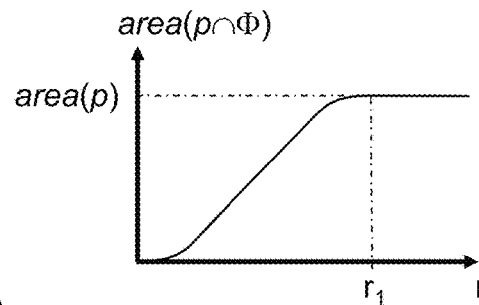
Fig. 24A  Fig. 24B
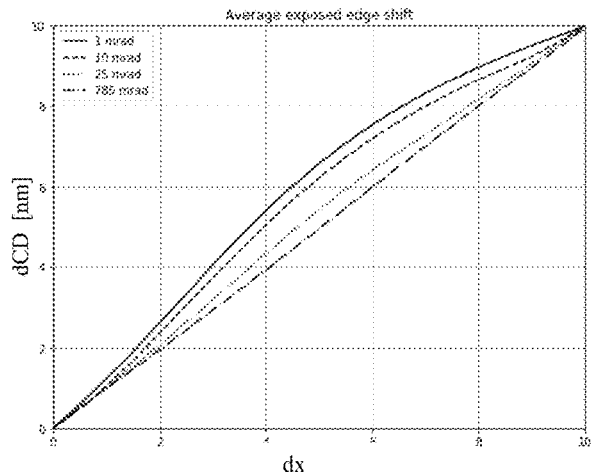 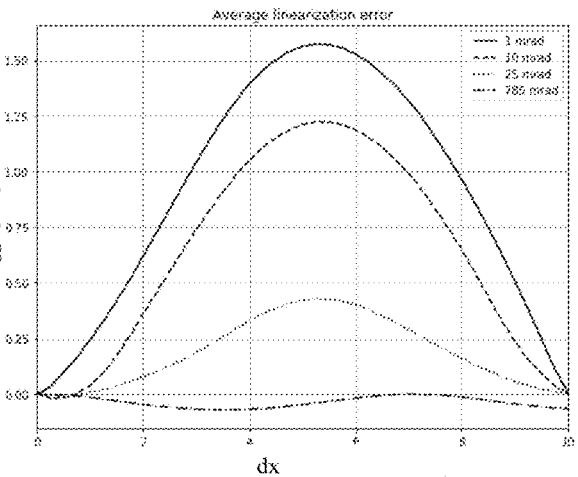
Fig. 25A  Fig. 25B
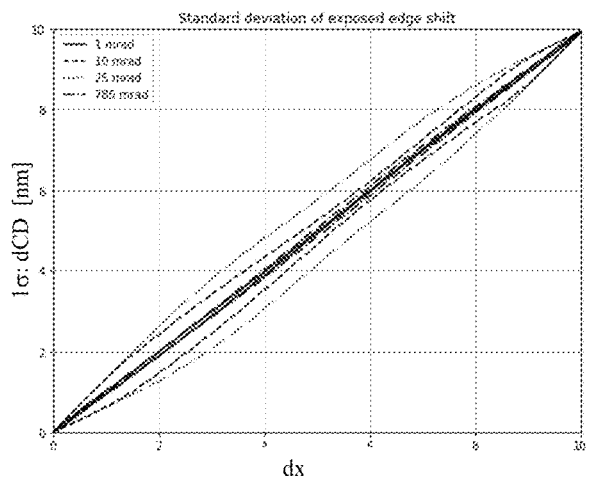 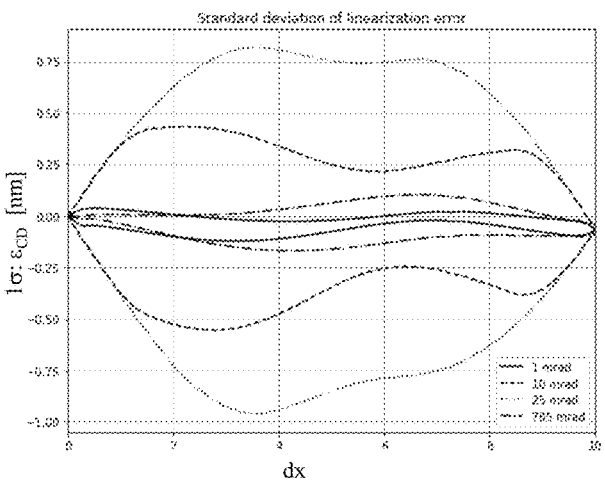
Fig. 25C  Fig. 25D

NON-LINEAR DOSE- AND BLUR-DEPENDENT EDGE PLACEMENT CORRECTION

CROSS REFERENCE TO RELATED APPLICATIONS

This application claims priority to U.S. Provisional Application No. 62/615,386, entitled "Non-linear Dose- and Blur-Dependent Edge Placement Correction" to Platzgummer et al., filed Jan. 9, 2018, the disclosure of which is incorporated by reference herein in its entirety.

FIELD OF THE INVENTION

The present invention relates to a method for calculating a pattern to be exposed on a target by means of a charged-particle multi-beam writing apparatus, said apparatus exposing a multitude of pixels within an exposure region on the target to generate said pattern by means of a scanning stripe exposure, wherein the pattern is realized as a pixel graphic composed of a plurality of pixels defined in accordance with a raster grid on the exposure region, wherein each of said pixels is represented by a geometric pixel shape located at a respective pixel position and is assigned an intensity value corresponding to a value of exposure dose to be exposed for the respective pixel, the method comprising the steps of:
(i) providing the vector pattern as a number of pattern elements, wherein each pattern element has a respective geometric shape comprising a boundary and an interior, and is associated with a respective assigned dose, said assigned dose defining a value of exposure dose to be exposed for pixels within the interior of the respective shape,
(ii) rasterizing the vector pattern into the pattern by calculating, for each of the plurality of pixels, respective intensity values based on the vector pattern.

BACKGROUND OF THE INVENTION

Charged-particle multi-beam processing apparatuses where a method of the mentioned type is used are well-known in prior art. In particular, the applicant has realized charged-particle multi-beam devices as described in several patents in the name of the applicant with respect to the charged-particle optics, pattern definition (PD) device, and multi-beam writing methods employed therein. For instance, a 50 keV electron multi-beam writer which allows to realize leading-edge complex photomasks for 193 nm immersion lithography, of masks for EUV lithography and of templates (1× masks) for imprint lithography, has been implemented, called eMET (electron Mask Exposure Tool) or MBMW (multi-beam mask writer), for exposing 6" mask blank substrates. Moreover, a multi-beam system also referred to as PML2 (Projection Mask-Less Lithography) was implemented for electron beam direct write (EBDW) applications on Silicon wafer substrates. The multi-beam processing apparatuses of the said kind are hereinafter referred to as multi-beam writer, or short MBW.

In the case of a MBW, the scanning stripe exposure is of the type where a structured beam composed of a plurality of beamlets is directed onto the target and moved along a path over the exposure region wherein between subsequent exposure steps the structured beam is shifted on the target by consecutive distances corresponding to an exposure length which is smaller than the width of the structured beam on the target.

As a typical implementation of a MBW, the applicant has realized a 50 keV electron writer tool, which implemented a total beam size of 20 nm comprising 512×512 (=262,144) programmable beamlets within a beam array field of dimensions 81.92 µm×81.92 µm at the substrate. In this writer tool a typical type of substrate is a 6" mask blank (having an area of 6"×6"=152.4 mm×152.4 mm and thickness of e.g. 1"/4=6.35 mm) covered with an electron beam sensitive resist; furthermore, multi-beam writing is possible on resist-covered 150 mm Si wafers as well. Further information about this writer tool of the MBW type can be found in U.S. Pat. No. 9,653,263 of the applicant, which is herewith incorporated into this disclosure by reference. The MBW is configured to perform a writing method which herein is referred to as "scanning stripe exposure". The scanning stripe exposure writing method is discussed below inasmuch as needed in the context of the invention with reference to FIGS. 1 to 7; further details about scanning stripe exposure can be found in in U.S. Pat. No. 9,053,906 of the applicant, which is herewith incorporated into this disclosure by reference.

Another state-of-the-art writer technology which is used to expose a pattern, such as a mask pattern on a glass substrate, is the so-called VSB technology (variable shaped beam). The VSB technology is based on a sequential delivery of "shots" on the substrate whereas the shots are adjustable in size and the dose per shot is controllable by a high-speed blanker. Typically, the current density of an advanced VSB writer is very high (100-1000 A/cm$^2$), whereas in a MBW the current density is in the order of 1-4 A/cm$^2$. Thus, the VSB writer current density is higher by a factor of up to 1000 as compared to a MBW. The improved productivity of a MBW originates from the very large number of beams ("beamlets"), which is typically in the order of 250 thousand or more. Hence, a multi-beam writer can theoretically deliver up to 250 times higher current than a VSB writer, despite the lower current density, if the same beam size is applied. Considering all instrumental and physical limitations such as Coulomb interaction within the particles in the beams, the multi-beam writer can practically still deliver about 10-25 times more current than a VSB writer, which explains the improvement in productivity.

In the design of patterns for exposure in charged particle writers, such as a MBW or VSB writer, it is common to assign a certain exposure dose level to the features; this exposure dose level is herein referred to as "assigned dose". It is common to use the double of the dose-to-clear (where "dose-to-clear" is herein used to denote the dose that just suffices to achieve positive exposure, i.e., development of the resist, and is abbreviated as $D_{DtC}$) as a standard value for the assigned dose; however, for certain cases, such as certain approaches for correction of feature sizes, the assigned dose may be modified to a different value. Usually, the assigned dose is raised—so-called "overdosing" (or "underdosing", where the dose of the relevant feature is reduced). While from the viewpoint of lithography, overdosing (or underdosing) of features has little to no impact on the quality of the exposure process, the state-of-the-art industrial user is used to VSB-based techniques where it is common to work with significant dose adjustments to correct for processing-related sizing effects such as by etching/erosion or pattern density related loading effects, wherein the specific amount of overdosing corresponds to the desired contraction or expansion of feature size, respectively. This may result in patterns where different pattern components have widely varying exposure dose levels, and in extreme cases, such dose adjustments can range from −40% underdosing up to +300% overdosing or more.

The assigned dose D of a feature is often expressed as the so-called dose factor, which is the assigned dose scaled to the double of the dose-to-clear ($D/2D_{DtC}$). This reflects the notion that a dose factor of 1 realizes an assigned dose which is the double of the dose-to-clear, realizing what is called "isofocal dose" since a change of focus (or, similarly, change of blur) will have a minimal impact on features written at or near the "isofocal dose".

SUMMARY OF THE INVENTION

In view of the above-discussed problems with non-linear behavior of edge shift, it is an aim of the present invention to provide a method for reducing the effect of the mentioned non-linearity and ensure correct edge placement of feature boundaries.

This aim is met by a method as described in claim 1. Further optional, advantageous features are given in the dependent claims. More in detail, the invention proposes to implement a position correction for edge positions of pattern element boundaries. Such a position correction for an edge position is performed during providing the vector pattern (step i) or during rasterizing (step ii), and includes the following sub-steps:

determining a position value describing said edge position, determining a corrected position value based on the position value using a predefined non-linear function ($f_{\xi(\Phi)}^{-1}$), and modifying the pattern to effectively shift the pattern element boundary in accordance with the corrected position value;

wherein this predefined non-linear function ($f_{\xi(\Phi)}^{-1}$) describes the inverse of the relationship ($f_{\xi(\Phi)}$) between a nominal position value, said nominal position value being used as input value during exposure of the pattern, and (resulting) position of the pattern element boundary generated when exposed with said nominal position value. By virtue of inverting the function, the nominal position value is translated into the desired corrected position value. The non-linear function further has at least one parameter, which relates to quantities describing other features of the pattern element or the exposure method employed; in particular, one parameter is the assigned dose of the pattern element involved.

With this solution, an efficient way for reducing or even entirely eliminating the undesired effect of non-linearity, and thus recovers a true imaging of features according to the desired critical dimension (CD).

In one suitable implementation of the method according to the invention, the position correction is performed in the step (ii) of rasterizing (for instance, at the end of step ii). In this case, the position correction is performed at least those pixels whose pixel shape is crossed by a boundary of a pattern element, in that the intensity value of a pixel is calculated by realizing the mentioned sub-steps as the following sub-steps:

determining a first area as the area of the fraction of the pixel shape covered by the pattern element whose boundary crosses said pixel shape, and determining a position value (d) as the ratio of the first area to the area of the entire pixel shape, determining an intensity value from the position value using the predefined non-linear function, and assigning the intensity value to the respective pixel.

In this case, an alternative description of the non-linear function may be as describing the inverse of the relationship between intensity value of a pixel, as generated by exposing such pixel with an exposure dose equivalent to the intensity dose, and geometric area portion of the pixel shape area of a pattern element boundary generated with such intensity value.

Alternatively, the position correction may be performed during the step (i) of providing the vector pattern. In this case the position correction is performed in that an edge position correction is made for at least one pattern element, by realizing the mentioned sub-steps as the sub-steps of:

determining the positions of boundary segments of the boundary with regard to the raster grid, determining corrected positions for each boundary segment as nominal edge positions based on the predefined non-linear function, and forming a reshaped pattern element, said reshaped pattern element having boundary segments which are offset in a direction perpendicular to the respective segments to locations in accordance with said corrected positions, and replacing the pattern element by the reshaped pattern element.

In this case, an alternative description of the non-linear function may be in that it describes the inverse of the relationship between a nominal edge position and the position relative to the raster grid when written using such nominal edge position.

As mentioned above, the non-linear function will be influenced by at least one parameter, of which one is the assigned dose of the pattern element involved, often expressed as dose factor (i.e., the ratio of the assigned dose to dose-to-clear level). Other parameters relate to specifics of the respective pattern component exposed and/or the exposure method employed, such as:

beamlet blur of the pixels imaged on the target, orientation of the boundary or edge of the respective pattern element, in particular with respect to the directions of the raster grid or the scanning direction of the scanning exposure, dose background, proximity-effect factor, with regard to the well-known proximity effect, density of the pixels with respect to the raster grid (as specified through the interlocking structure, cf. FIGS. 8A-8C, and the oversampling described by oversampling factor o).

In a further development of the invention, an efficient way of representing the non-linear function and/or its inverse function is by way of one or more tables. Thus, the function(s) may be specified through at least one set of points of support, each point of support specifying a numeric value of nominal position value (intensity value/nominal edge position) and a numeric value of associated position value (geometric area portion/edge position), at a specific value of parameter of the non-linear function. These numeric values were derived in advance, for instance through computer simulations and/or experimental measurements. Values of the non-linear function lying between points of support are interpolated according to a suitable interpolation method as well-known in the art, such as linear interpolation between the two next-neighbor points of input value, or even simpler, look-up of the next-neighbor point (interpolation to 0th order).

The method of the invention is particularly suited for a scanning stripe exposure of the type where a structured beam composed of a plurality of beamlets is directed onto the target and moved along a path over the exposure region wherein between subsequent exposure steps the structured beam is shifted on the target by consecutive distances corresponding to an exposure length which is smaller than the width of the structured beam on the target.

In advantageous embodiments of the invention, the pattern thus generated may be used in a writing process with overlapping exposure spots, where the writing process of the scanning stripe exposure generates mutually overlapping aperture images on the target; in other words, the aperture images have a nominal width which is a multiple (i.e., by a factor o which is greater one) of the distance e between pixel positions of neighboring aperture images generated on the target. In this case, preferably, there is an additional step:

(iii) generating, from the pattern obtained in step (ii), an exposure pattern suitable to expose the pattern by said writing process through exposure of aperture images.

Furthermore, the invention also includes a method for exposing a pattern on a target by means of a charged-particle multi-beam writing apparatus, said apparatus being of the type as mentioned, and in particular configured to expose a multitude of pixels within an exposure region on the target to generate said pattern by means of a scanning stripe exposure, with the method including:

providing the pattern to a processing system associated with said apparatus, the pattern being realized as a pixel graphic composed of a plurality of pixels defined in accordance with a raster grid on the exposure region, wherein each of said pixels is represented by a geometric pixel shape located at a respective pixel position and is assigned an intensity value corresponding to a value of exposure dose to be exposed for the respective pixel;

calculating, in said processing system, a corrected pattern by applying a position correction as described herein to said pattern; and performing an exposure process according to the corrected pattern in said apparatus.

BRIEF DESCRIPTION OF THE DRAWINGS

In the following, in order to further demonstrate the present invention, illustrative and non-restrictive embodiments are discussed, as shown in the drawings, which schematically show:

FIG. 8A: "Double Grid", FIG. 8B: "Quad Grid", and FIG. 8C: "Double-Centered Grid";

FIG. 15A, a dose factor of 1 with a 1-sigma beam blur of 5 nm; FIG. 15B, a dose factor of 2 with a blur of 5 nm; and FIG. 15C, a dose factor of 2 with a blur of 10 nm.

FIG. 19A shows a line feature coinciding with the pixel borders.

FIG. 23 shows a tabulated representation of the non-linearity function;

FIG. 24A,B illustrate the relationship between structure edge position and affected portion of a pattern pixel area for a pixel located at the structure edge, with FIG. 24A depicting a geometric rendition of the structure edge, and FIG. 24B visualizing the functional relation of the area of the intersection;

FIG. 25A-D illustrate the non-linear effect of slope of an edge upon edge positioning, with FIG. 25A showing the change of edge position dCD (average exposed edge shift) as function of edge position dx relative to the pixel grid, at various values of the angle of the edge direction as indicated, FIG. 25B showing the corresponding average linearization error $\varepsilon_{CD}$=dCD−dx, FIG. 25C illustrating the 1-sigma variation of the displacement along the line (standard deviation of exposed edge shift; the displacement is measured perpendicular to the line direction), and FIG. 25D showing the corresponding 1-sigma variation of the linearization error $\varepsilon_{CD}$.

DETAILED DESCRIPTION OF EMBODIMENTS OF THE INVENTION

The detailed discussion of exemplary embodiments of the invention given below discloses the basic concepts and further advantageous developments of the invention. It will be evident to the person skilled in the art to freely combine several or all of the embodiments discussed here as deemed suitable for a specific application of the invention. Throughout this disclosure, terms like "advantageous", "exemplary" or "preferred" indicate elements or dimensions which are particularly suitable (but not essential) to the invention or an embodiment thereof, and may be modified wherever deemed suitable by the skilled person, except where expressly required. It will be appreciated that the invention is not restricted to the exemplary embodiments discussed in the following, which are given for illustrative purpose and merely present suitable implementations of the invention.

The present invention addresses a problem of non-linearity observed by the inventors. Specifically, conventionally, it is assumed that increasing the dose of the outermost pixel at the edge of a feature causes a corresponding linear shift of the dose profile. (See the discussion below with reference to FIGS. 15A-C.) The inventors have observed that the edge shift is merely almost a linear function of the dose value at the "edge pixel". While this non-linearity is small and may be neglected in many practical cases, there are cases where the non-linear behavior may cause significant deviations for feature size. In particular, this non-linearity may cause a significant alteration of feature size when changing the position of a feature with a dose factor significantly deviating from 1.

Compared to state-of-the-art concepts concerning the linearity of pattern size and critical dimension, such as mask processing correction (MPC) or proximity effect correction (PEC) as discussed, e.g., in US 2012/329289 A1, the present invention also includes the insight that the pattern position relative to the raster grid used for exposing said patterns (or, more generally, the interplay between raster grid and pattern position) is utilized.

Lithographic Apparatus

Figure 1:
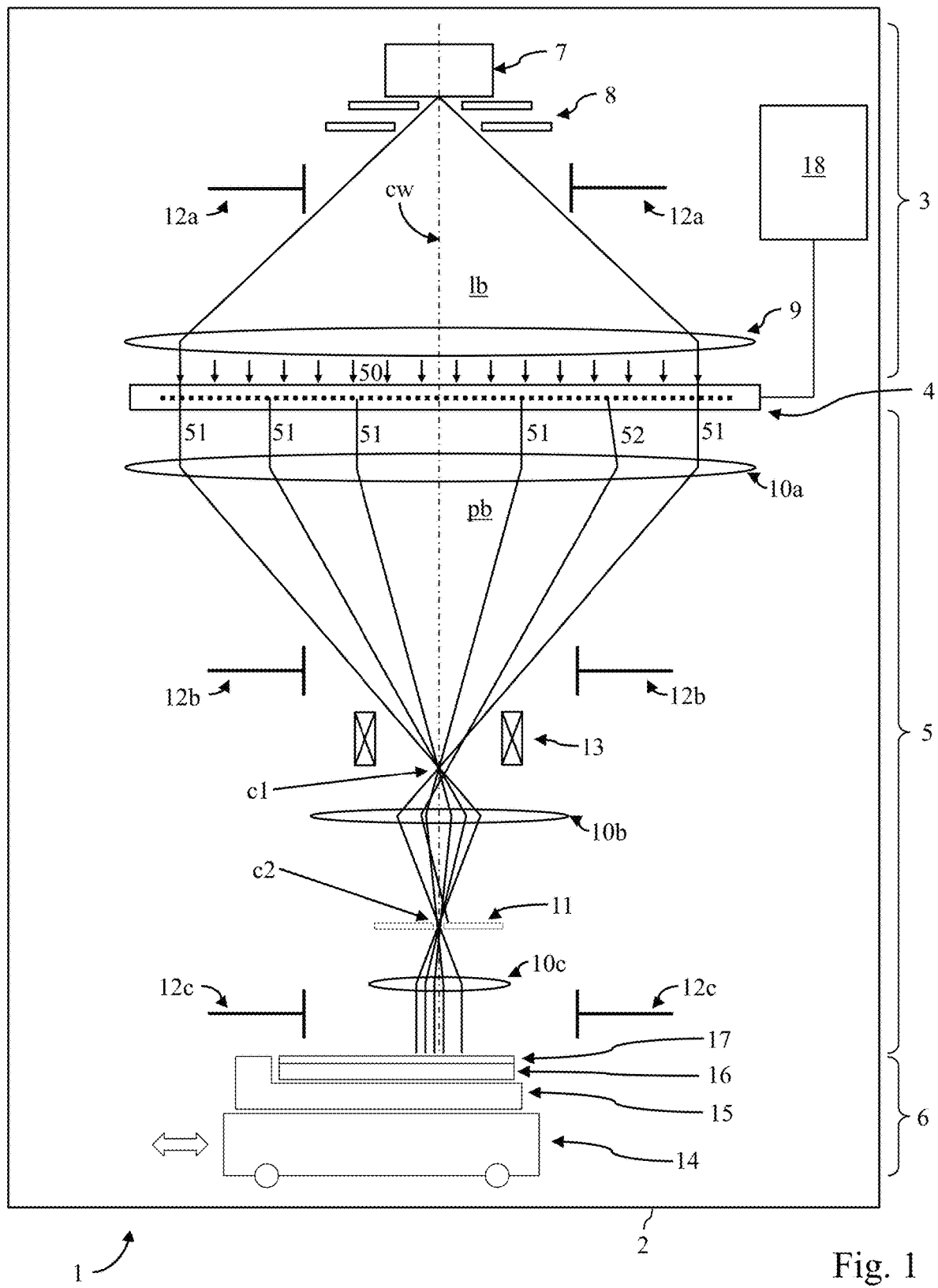
FIG. 1 a lithographic system of state of the art in a longitudinal sectional view.

An overview of a lithographic apparatus suitable to employ the preferred embodiment of the invention is shown in FIG. 1. In the following, only those details are given as needed to disclose the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb of charged particles along the optical axis cw of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a broad, substantially telecentric particle beam 50 serving as lithography beam lb. The lithography beam lb then irradiates a PD system 4 which comprises a number of plates with a plurality of openings (also referred to as apertures). The PD system 4 is held at a specific position in the path of the lithography beam lb, which thus irradiates the plurality of apertures and/or openings and is split into a number of beamlets.

Some of the apertures/openings are "switched on" or "open" so as to be transparent to the incident beam in the sense that they allow the portion of the beam that is transmitted through it, i.e. the beamlets 51, to reach the target; the other apertures/openings are "switched off" or "closed", i.e. the corresponding beamlets 52 cannot reach the target, and thus effectively these apertures/openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to the pattern to be exposed on the substrate 16 covered with charged-particle sensitive resist 17. It has to be noted that the "switching on/off" of the apertures/openings is usually realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam pb is then projected by means of an electro-magneto-optical projection system 5 onto the substrate 16 where the beam forms an image of the "switched-on" apertures and/or openings. The projection system 5 implements a demagnification of, for instance, 200:1 with two crossovers c1 and c2. The substrate 16 is, for instance, a 6" mask blank or a silicon wafer covered with a particle sensitive resist layer 17. The substrate is held by a chuck 15 and positioned by a substrate stage 14 of the target station 6.

The information regarding the pattern to be exposed is supplied to the PD system 4 by the data path realized by means of an electronic pattern information processing system 18. Further details of the data path are given in the section "Data path" below.

In the embodiment shown in FIG. 1, the projection system 5 is composed of a number of consecutive electro-magneto-optical projector stages 10a, 10b, 10C, which preferably include electrostatic and/or magnetic lenses, and possibly other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. 200:1 reduction. A demagnification of this order is in particular suitable with a lithography setup, in order to alleviate problems of miniaturization in the PD device.

In the whole projection system 5, provisions are made to extensively compensate the lenses and or deflection means with respect to chromatic and geometric aberrations. As a means to shift the image laterally as a whole, i.e. along a direction perpendicular to the optical axis cw, deflection means 12*a*, 12*b* and 12*c* are provided in the condenser 3 and projection system 5. The deflection means may be realized as, for instance, a multipole electrode system which is either positioned near the source extraction system 8 or one of the crossovers, as shown in FIG. 1 with the deflection means 12*b*, or after the final lens 10*c* of the respective projector, as in the case with the stage deflection means 12*c* in FIG. 1. In this apparatus, a multipole electrode arrangement is used as deflection means both for shifting the image in relation to the stage motion and for correction of the imaging system in conjunction with the charge-particle optics alignment system. These deflection means 10*a*, 10*b*, 10*c* are not to be confused with the deflection array means of the PD system 4 in conjunction with the stopping plate 11, as the latter are used to switch selected beamlets of the patterned beam pb "on" or "off", whereas the former only deal with the particle beam as a whole. There is also the possibility to rotate the ensemble of programmable beams using a solenoid 13 providing an axial magnetic field.

Figure 2:
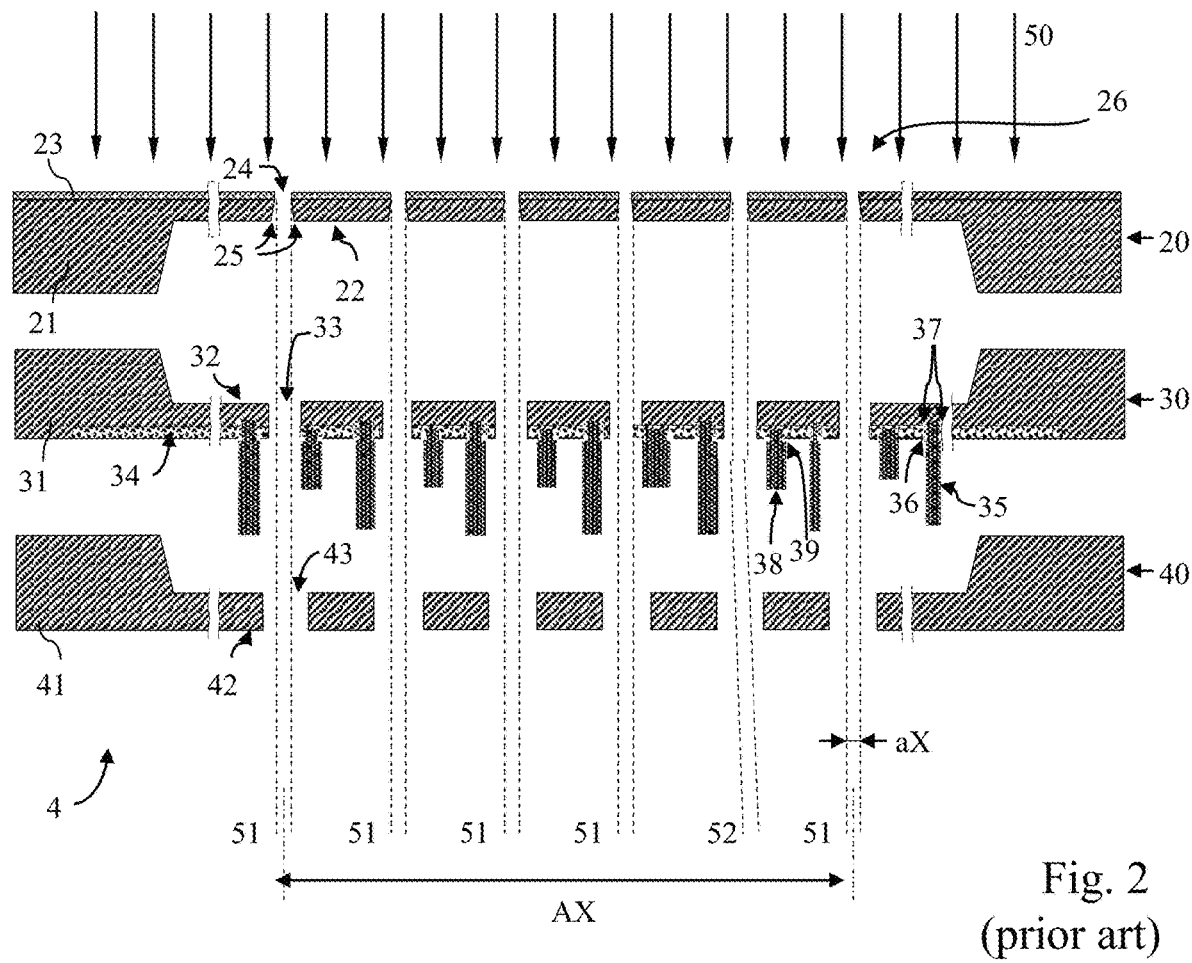
FIG. 2 a pattern definition system state of the art in a longitudinal section.

The sectional detail of FIG. 2 illustrates one suitable embodiment of a PD system 4, which comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction (vertical axis in FIG. 2).

The flat upper surface of AAP 20 forms a defined potential interface to the charged-particle condenser optics/illumination system 3. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (like in U.S. Pat. No. 6,858,118). When using electrons or heavy ions (e.g. argon or xenon), the layer 23 may also be of silicon provided by the surface section of 21 and 22, respectively, so that there is no interface between layer 23 and the bulk parts 21, 22.

The AAP 20 is provided with a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array (cf. FIG. 4). In the embodiment shown, the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual beamlets passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of the thinned part 22). The aperture openings 33 in the center part 32 are wider compared to 24 (by approx. 2 μm at each side for instance). CMOS electronics 34 is provided to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding beamlet, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beamlets.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, e.g. with embedded ground and deflection electrodes, can be devised by the skilled person (see other patents in the name of the applicant, such as U.S. Pat. No. 8,198,601 B2).

The third plate 40 serving as FAP has a flat surface facing to the first lens part of the down-stream demagnifying charged-particle projection optics 5 and thus provides a defined potential interface to the first lens 10*a* of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing therethrough (FIG. 2). The deflected beamlet can traverse the DAP and FAP unhindered as the openings 33 and 43, respectively, are made sufficiently wide. However, the deflected beamlet 52 is filtered out at the stopping plate 11 of the sub-column (FIG. 1). Thus, only those beamlets which are unaffected by the DAP will reach the substrate.

The reduction factor of the demagnifying charged-particle optics 5 is chosen suitably in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

The ensemble of (unaffected) beamlets 51 as formed by AAP is projected to the substrate with a predefined reduction factor R of the projection charged-particle optics. Thus, at the substrate a "beam array field" (BAF) is projected having widths BX=AX/R and BY=AY/R, respectively, where AX and AY denote the sizes of the aperture array field along the X and Y directions, respectively. The nominal width of a beamlet at the substrate (i.e. aperture image) is given by bX=aX/R and bY=aY/R, respectively, where aX and aY denote the sizes of the beamlet 51 as measured along the X and Y directions, respectively, at the level of the DAP 30. Thus, the size of a single aperture image formed on the target is bX×bY.

It is worthwhile to note that the individual beamlets 51, 52 depicted in FIG. 2 represent a much larger number of beamlets, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beamlets. The applicant has realized such columns with a BAF of approx. 82 µm×82 µm at the substrate. These examples are stated for illustrative purpose, but are not to be construed as limiting examples.

Writing a Pattern

Figure 3:
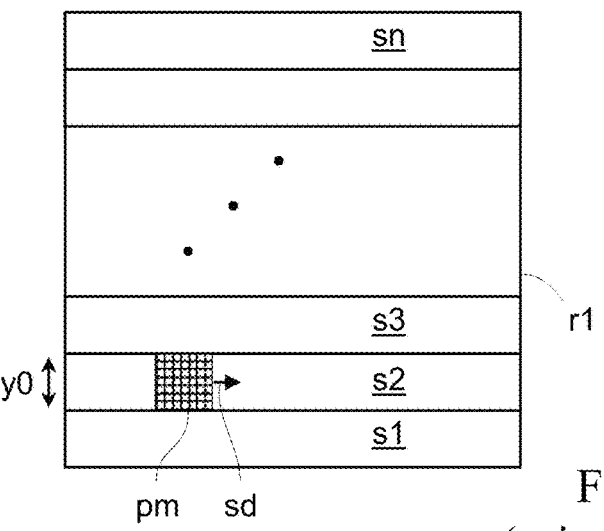
FIG. 3 illustrates the basic writing strategy on the target using stripes.

Referring to FIG. 3, a pattern image pm as defined by the PD system 4 is produced on the target 16. The target surface covered with the charged-particle sensitive resist layer 17 will comprise one or more areas r1 to be exposed. Generally, the pattern image pm exposed on the target has a finite size y0 which is usually well smaller than the width of the area r1 which is to be patterned. Therefore, a scanning stripe exposure strategy is utilized, where the target is moved under the incident beam, so as to change the position of the beam on the target perpetually: the beam is effectively scanned over the target surface. It is emphasized that for the purpose of the invention only the relative motion of the pattern image pm on the target is relevant. By virtue of the relative movement the pattern image pm is moved over the area r1 so as to form a sequence of stripes s1, s2, s3, . . . sn (exposure stripes) of width y0. The complete set of stripes covers the total area of the substrate surface. The scanning direction sd may have uniform orientation, or it may have alternate direction of movement from one stripe to the next.

Figure 5A:
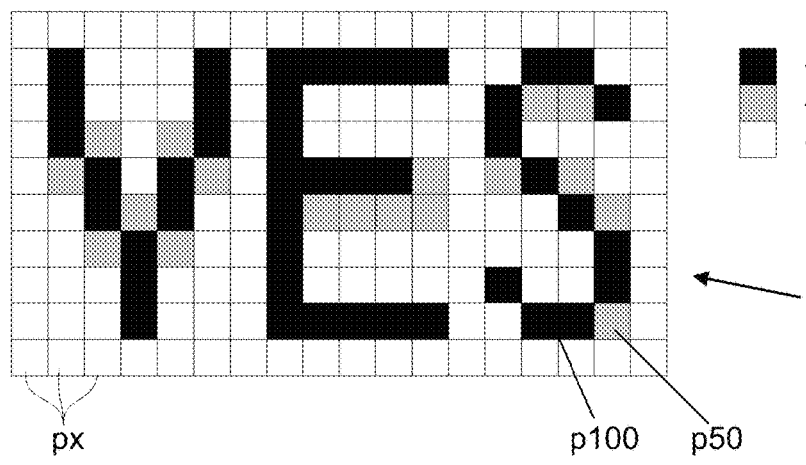
FIGS. 5A and 5B show an example of a pixel map of an exemplary pattern to be exposed.
Figure 5B:
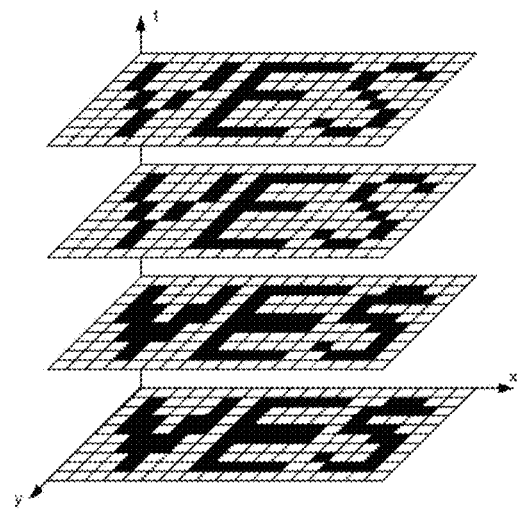

FIG. 5A shows a simple example of an imaged pattern ps with a size of 10×18=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). FIG. 5B illustrates how a 50% level is realized: each pixel is exposed several times, and for a pixel with a gray level between 0 and 100%, the gray level is realized by choosing a corresponding number of the exposures with the pixel activated; the gray level is the fraction of activated exposures over the total number of exposures. In this example, a 50% level is realized by choosing 2 out of 4. Of course, in a realistic application of the invention, the number of pixels of the standard image would be much higher. However, in FIGS. 5A+B the number of pixels is only 180 for the better clarity. Also, in general, much more gray levels will be used within the scale from 0% to 100%.

Thus, the pattern image pm (FIG. 3) is composed of a plurality of pattern pixels px, which are exposed with dose values according to the desired pattern to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1)$ . . . , $i/(n_y-1)$, . . . , 1 with $n_y$ being the number of gray values and i being an integer ("gray index", $0 \le i \le n_y$). Generally, however, the gray values need not be equidistant and form a non-decreasing sequence between 0 and 1.

Figure 4:
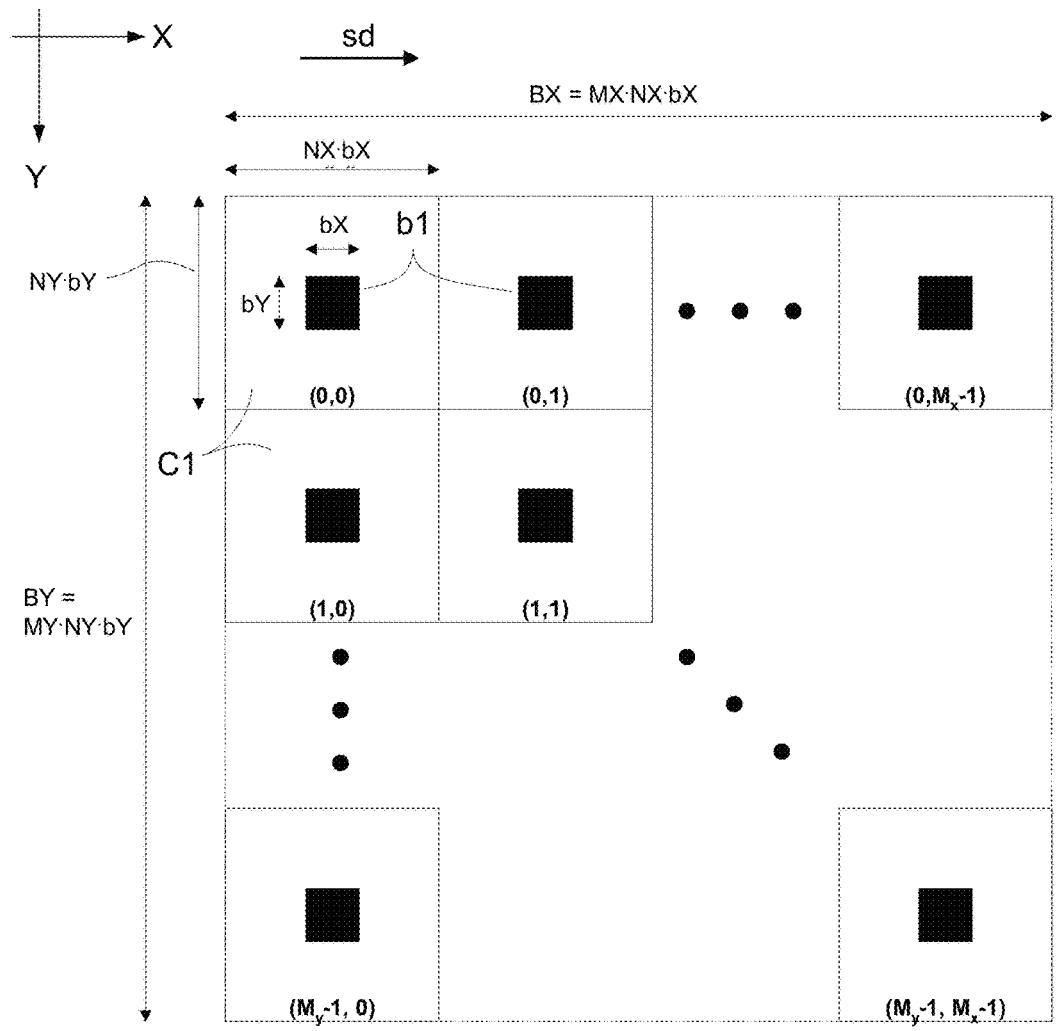
FIG. 4 shows an exemplary arrangement of apertures as imaged onto the target.

FIG. 4 shows the arrangement of apertures in the aperture field of the PD device, according to a basic layout and also illustrates several quantities and abbreviations used in the following. Shown is the arrangement of the aperture images b1 as projected onto the target, shown in dark shades. The main axes X and Y correspond to the direction of advance of the target motion (scanning direction sd) and the perpendicular direction, respectively. Each aperture image has widths bX and bY along the directions X and Y respectively. The apertures are arranged along lines and rows having MX and MY apertures, respectively, with the offset between neighboring apertures in a line and row being NX·bX and NY·bY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

Figure 6A:
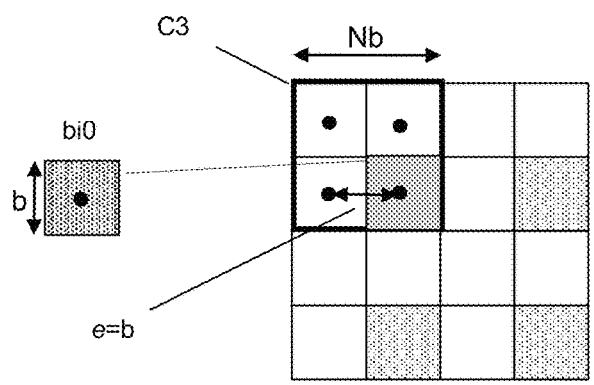
FIG. 6A illustrates an arrangement of apertures with M=2, N=2.

The pitch between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of) one pixel. In another interesting case, illustrated in FIG. 6B (and in line with the teachings of U.S. Pat. Nos. 8,222,621 and 7,276,714), e may be a fraction b/o of the width b of the aperture image, with o>1 being preferably (but not necessarily) an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

Figure 6B:
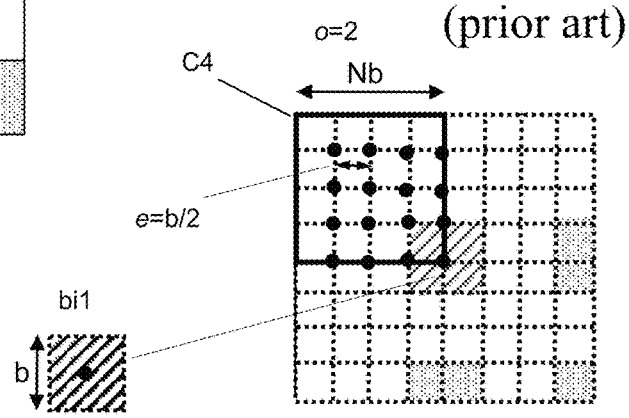
FIG. 6B shows an example of oversampling of the pixels in a "double grid" arrangement.

FIG. 6B illustrates one example of an oversampling of o=2 combined with placement grids, referred to as "double-grid": namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing a suitable gray value for the aperture image that cover the respective pixel. As a result, an area of size b×b is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2=4$ pixels in the case of oversampling with o=2 in FIG. 6B (also called "double grid"). Of course, o may take any other integer value as well, in particular 4 ("quad grid", not shown) or 8. The parameter o may also be assigned a non-integer value greater one, such as $2^{1/2}=1.414$ or $2^{3/2}=2.828$, corresponding to the case of the "Double-Centered Grid" shown in U.S. Pat. No. 9,653,263.

It is worthwhile to note that with interlocking grids (o>1) it is possible to increase the number of gray shades by "dithering" while the dose distribution remains homogeneous. The basis for this is that the grey shades on any nominal grid are equal. This means that for the double interlocking grid the number of effective dose levels that can be realized is four times higher than for the non-interlocking grid. Generally speaking any oversampled exposure grid (i.e., o>1) consists of up to $o^2$ nominal grids shifted by distances b/o in X and Y direction. Thus, the step from one dose level to the next can be divided into o sub-steps where the dose level of only one of these o grids is increased; this can be repeated for the other grids until all sub-grids expose the nominal level. As the skilled person will appreciate, the beam shape at the substrate is the convolution of the machine blur and the reduced aperture shape of the aperture plate. It is possible to obtain a homogeneous dose distribution on the substrate by setting the width b to a natural multiple of the exposure grid constant e; in other words, making o=b/e an integer. Otherwise the dose distribution may have minima and maxima with a periodicity of the exposure grid, by virtue of aliasing effects. A high number of gray shades allows better feature placement. Therefore increasing the gray levels is of relevance where the gray shades per pixel position are limited to a certain number.

Figure 7A:
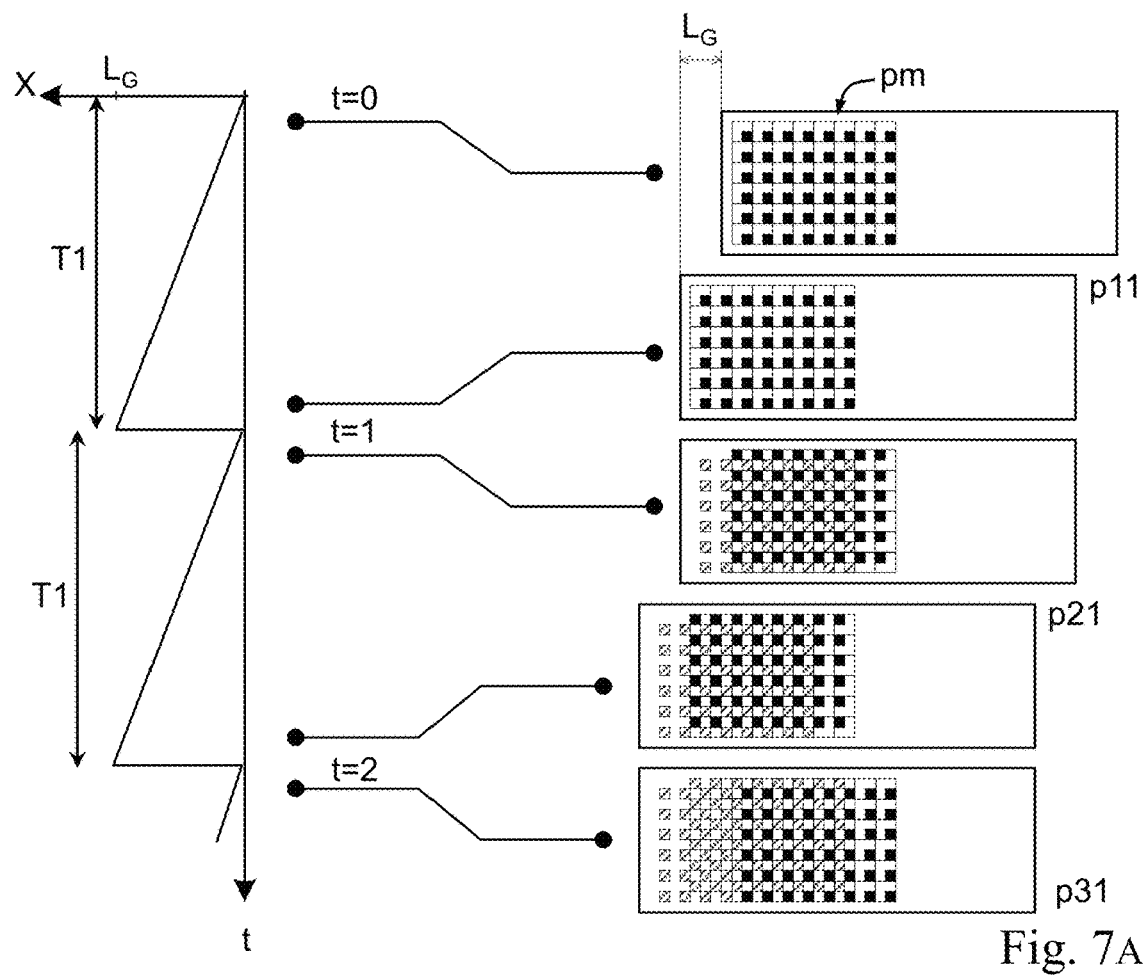
FIG. 7A illustrates the exposure of one stripe.

FIG. 7A shows an exposure scheme of the pixels, which is suitable for the scanning stripe exposure, which is preferably used with the invention. Shown is a sequence of frames, with increasing time from top (earlier) to bottom (later). The parameter values in this figure are o=1, N=2; also, a rectangular beam array is assumed with MX=8 and MY=6. The target moves continuously to the left, whereas the beam deflection is controlled with a seesaw function as shown on the left side of the figure. During each time interval of length T1, the beam image stays fixed on a position on the target (corresponding to a position of a "placement grid"). Thus, the beam image pm is shown to go through a placement grid sequence p11, p21, p31. One cycle of placement grids is exposed within a time interval L/v=NMb/v, by virtue of the target motion v. The time T1 for exposure at each placement grid corresponds to a length, which we call "exposure length", given by $L_G=vT1=L/p=NMb/p$, where p denotes the number of exposure positions within a cell ($p=No^2$ for a regular oversampled grid).

The beamlets are moved over the distance of L during the exposure of one set of image elements together with the target. In other words, all beamlets maintain a fixed position with regard to the surface of the substrate during the time interval T1. After moving the beamlets with the target along distance $L_G$, the beamlets are relocated instantaneously (within a very short time) to start the exposure of the image elements of the next placement grid. After a full cycle through the positions p11 ... p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

It is remarked that FIG. 7A neglects the time needed for opening/closing the individual apertures according to the actual pattern. In reality the deflecting devices of the DAP and deflection multipole systems need a certain settling time interval $T_s$, to settle the status of the apertures after repositioning and fading out of transient oscillations. The settling time interval $T_s$ is a (very) small fraction of the pixel exposure cycle T1. Therefore, rather than the entire pixel exposure cycle T1, only a usable time $Tu=T1-T_s$ is used for the exposure of pixels. The time interval Tu is the pixel exposure period within which to ensure that the appropriate dose is passed to the respective pixels. In the following, however, it is assumed that $T_s$ is negligible as compared to T1, and no discrimination is made between Tu and T1 hereinafter.

The usable exposure time Tu is divided into g time slots, corresponding to the number of gray shades possible to address. One value for g would be g=16 (4 bit). The pixel exposure is activated according to the desired gray shade, which is the sum of used time slots within Tu. If the dose applied to one pixel within the time Tu is digitized into g gray levels, it is possible to reload a general blanking cell g times during Tu; each blanking cell in the blanking array receives its individual gray shade during the exposure period T1 (or more accurately, the usable time Tu).

Figure 7B:
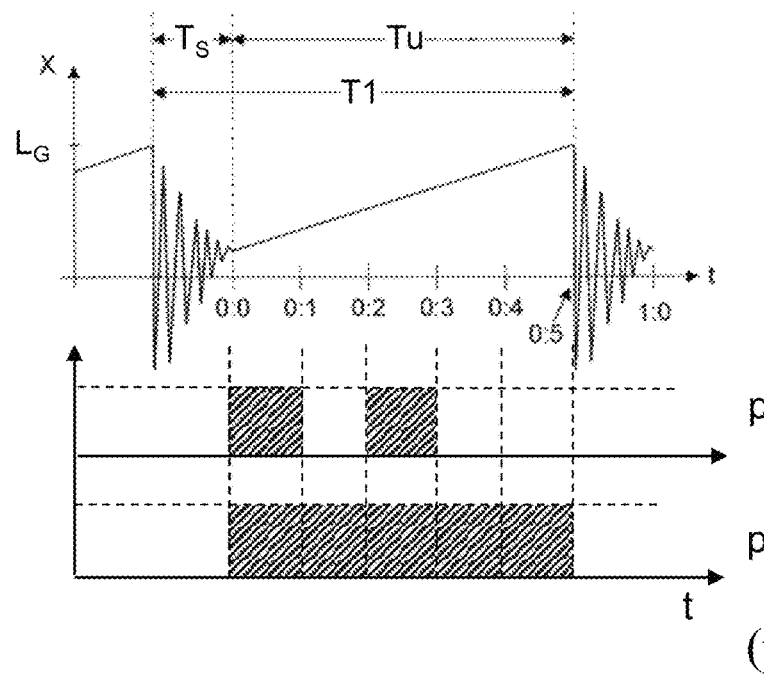
FIG. 7B illustrates the exposure of gray levels.

FIG. 7B illustrates the exposure of two pixels with different gray shades in a simplified example with g=5; the relative size of the settling time interval $T_s$ is greatly exaggerated. In accordance with g=5 there are five time slots in each usable time interval Tu. A first pixel p72 is exposed at a gray shade at 100% (i.e., "black"), and a second pixel p71 at a gray shade of 40%. For pixel p71 two time slots of a corresponding blanking electrode generate a gray shaded pixel; in this example, since 40% corresponds to a gray shade with 2 out of 5, and two of them—in arbitrary order—are set to switched-on. On the other hand, for pixel p72 the respective blanking electrode is activated during all five time slots, thus generating a black pixel with the maximum dose that may be deposited during Tu.

Exposure of Features in Double and Quad Grids

Figure 8A:
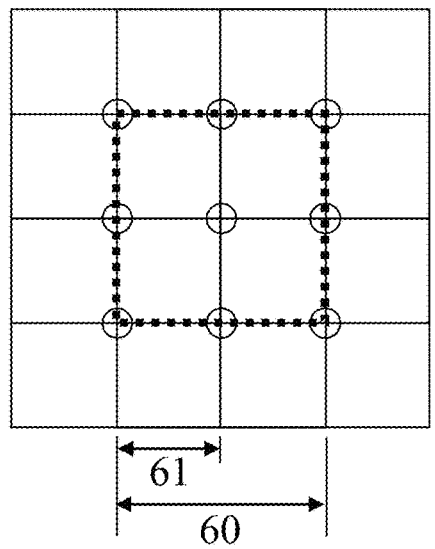
FIGS. 8A-C show three different cases of grid placements, namely
Figure 8B:
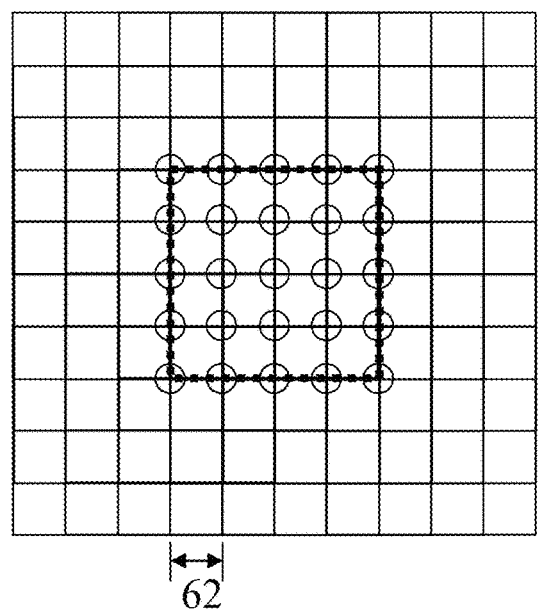
Figure 8C:
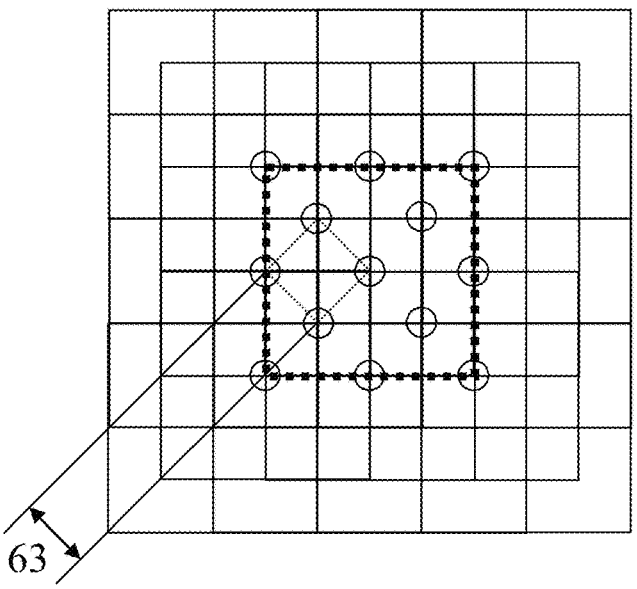

Referring to FIGS. 8A-8C, each exposure spot 60 corresponding to an aperture image bi0, bi1 (FIG. 6A,B) is exposed with discrete dose levels as will be discussed in more detail below. FIGS. 8A-C illustrate various overlap configurations of special interest.

FIG. 8A depicts the "Double Grid" multi-beam exposure as discussed above with FIG. 6B, where the overlap between the exposure spots is half of the beam spot size in the X and Y directions. In this case the physical grid size 61 is half of the linear size of the spots 60.

FIG. 8B illustrates a "Quad Grid" multi-beam exposure, where the overlap between the spots is ¼ of the beam spot size in the X and Y directions. In this case the physical grid size 62 is a quarter of the spot size width.

FIG. 8C depicts another grid layout, where in addition to Double Grid overlapping beam exposures, beam exposures are done in the centers in between. Therefore, the physical grid size 63 is (½)^{3/2} (i.e., √2/4) of the linear spot size. This multi-beam exposure mode is called "Double-Centered Grid".

Figure 9:
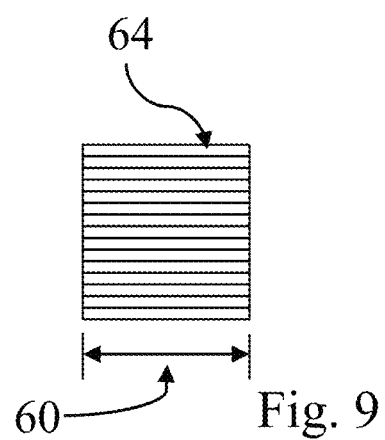
FIG. 9 illustrate the intensity profile which is generated when one single exposure spot is exposed with a maximum dose.

FIG. 9 shows a symbolic depiction ("brick-layer") of an intensity profile of one exposure spot (whose width is indicated as 60) which is exposed with a maximum dose level. In the exemplary case of a 4 bit coding, there are 16 dose levels (0, 1, 2, . . . 15), i.e. the maximum dose level is the sum of 15 dose level increments 64.

Figure 10:
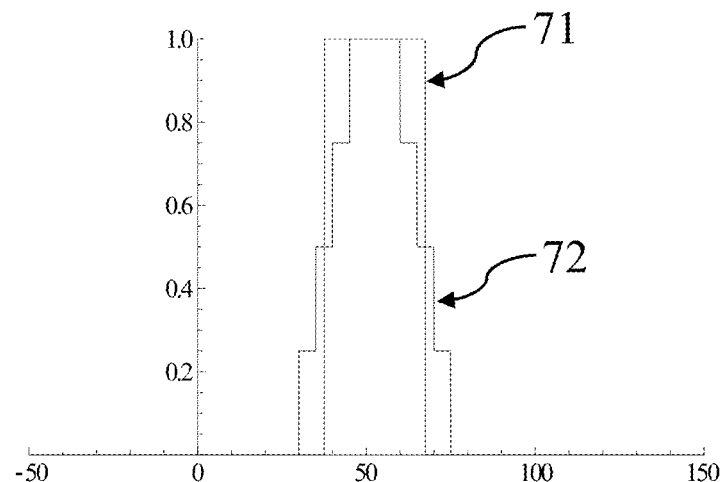
FIG. 10 illustrates an intensity profile of the MBW of the type shown in FIG. 1, and a dose level profile for a 30 nm line.
Figure 13:
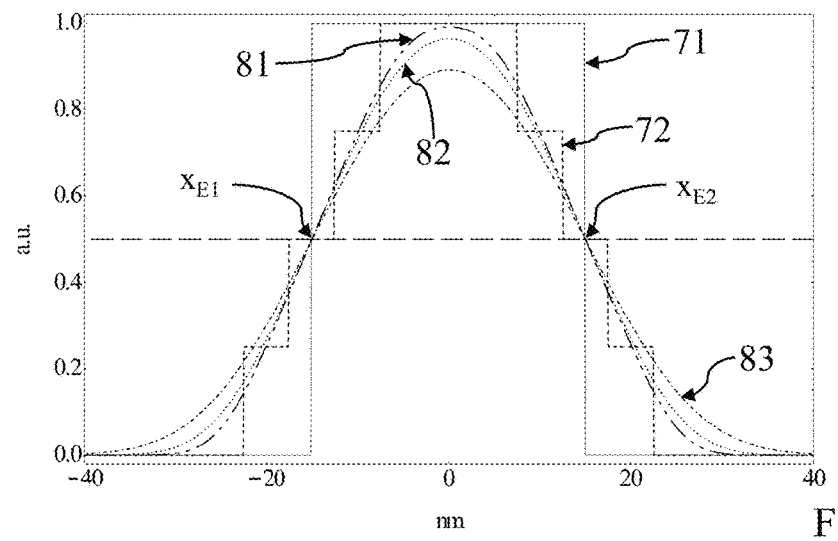
FIG. 13 illustrates the generation of a 30 nm line with the MBW.

FIG. 10 shows the ideal intensity profile 71 for a line of a width 30 nm, in the idealized case of zero blur. When using "Quad Grid" multi-beam exposure the overlap is a quarter of the beam size. Thus, for the case of 20 nm beam size the physical grid size is 5 nm. A discrete dose level can be assigned to each area of the physical grid, which is 5 nm×5 nm for the example chosen; the line 72 in FIG. 10 indicates the superposition of the intensity (or total dose) as it is composed by the overlapping exposure spots with discrete dose levels assigned to the pixel positions for generating the 30 nm line, whereas for better visibility the blur has been set to zero (so that the dose distribution of a single exposure spot becomes a rectangle). If the blur has a realistic value such as shown in FIG. 13, the step function at the edge of the rectangle is convoluted with a Gaussian function, which eventually transforms to a Gaussian shape. In that sense the line 72 can be seen as superposition of Gaussian functions at blur zero. In the general case the dose level histogram will not be symmetrical in order to position the left and right edge at pre-defined positions.

Figure 11:
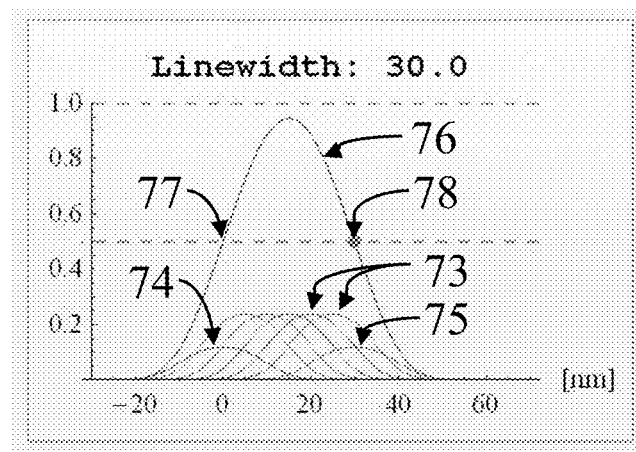
FIG. 11 shows an intensity profile for the 30 nm line dose level profile of FIG. 10.

FIG. 11 shows a simulation for a line of 30.0 nm width, with the left edge to be positioned at 0.0 nm and the right edge at 30.0 nm. For the simulation, it was assumed that beam spots of 20 nm are exposed with 5.1 nm 1 sigma blur (i.e., 12.0 nm FWHM blur). The intensity profile 76 is formed by overlapping the profiles of the exposure spots 73, 74, and 75. The dose level of the leftmost exposure spot 74 is adjusted such that the 30 nm line starts at the desired start position 77, i.e. at 0 nm. The dose level of the rightmost exposure spot 75 is adjusted such that the exposed line ends at position 78 at 30.0 nm. As can be seen in FIG. 11, in accordance with "Quad Grid" exposure, the overlap of the exposure spots 73, 74, 75 is a quarter of the beam size, i.e. 5 nm.

Figure 13A:
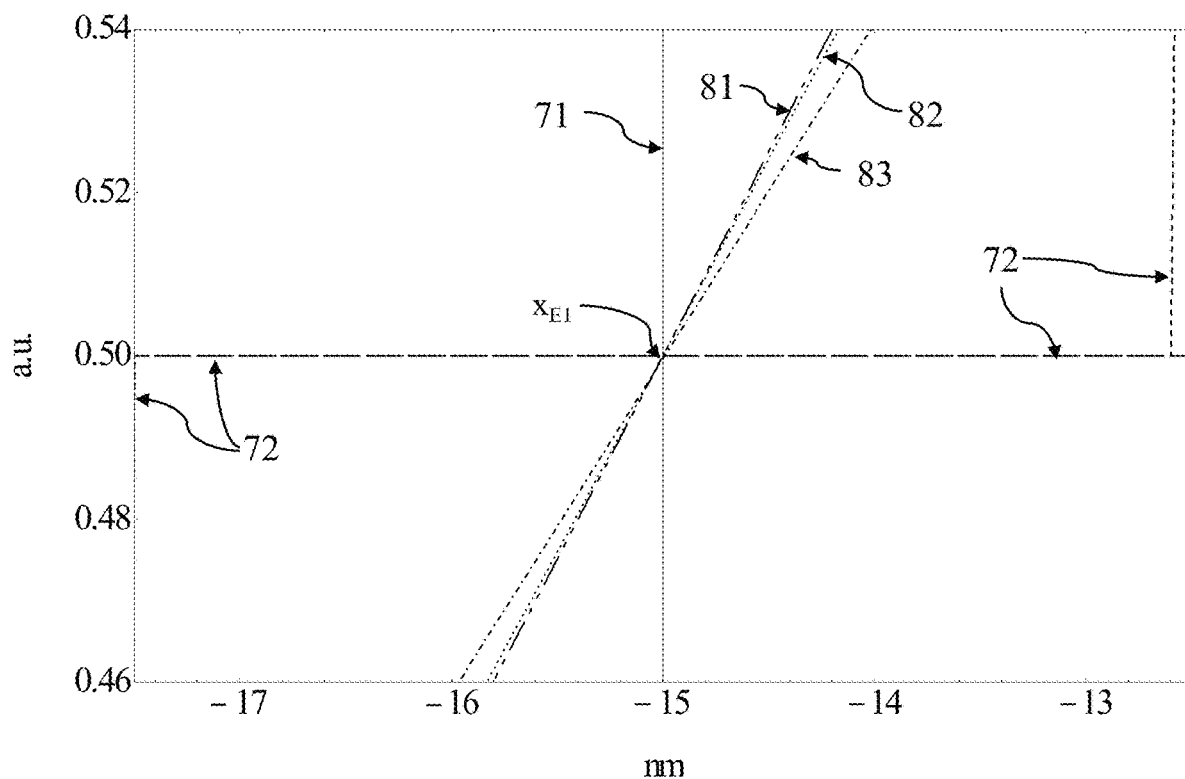
FIG. 13A shows a detail of FIG. 13 at the left-hand flank where the intensity profiles crosses the "0.5" intensity level.

When using the so-called "isofocal dose", that is, twice the "dose-to-clear" of the resist, the feature size (e.g. line width) is virtually independent of blur at the 50% dose threshold. This is illustrated in FIG. 13, which shows the intensity profile 71 for zero blur, the dose level histogram 72, and resulting intensity profiles 81, 82, 83 calculated with 3.5 nm, 5.0 nm, and 7.5 nm 1 sigma blur, respectively. The edge positions $x_{E1}$ and $x_{E2}$ of the generated structure are where the zero blur intensity profile 71 crosses the "0.5" intensity level ("dose-to-clear"). The enlarged detail of FIG. 13A shows the region around the position $x_{E1}$ at the left-side flank. The dose level assignments 72 are for using 20 nm beam size with 1 sigma blur of 5 nm and Quad Grid multi-beam exposure, providing a 5 nm physical grid size.

Figure 14A:
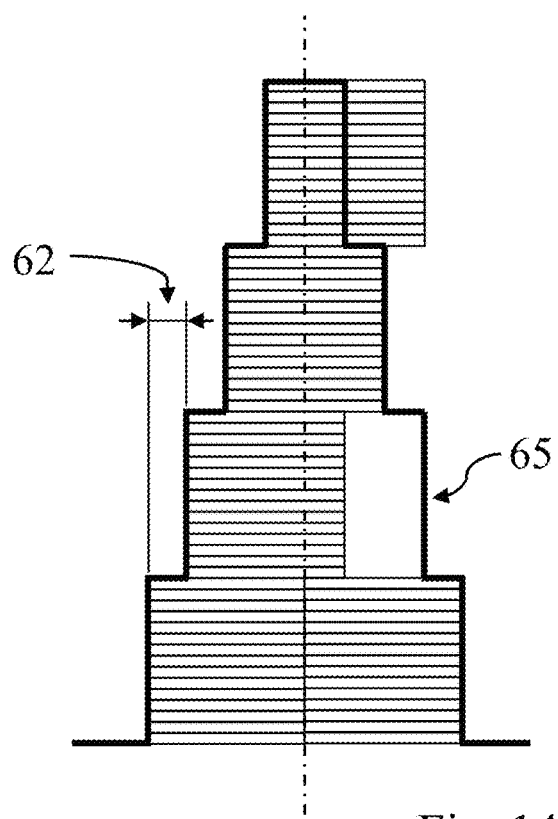
FIG. 14A illustrates the intensity profile generated from the exposure of a line of a determined width.
Figure 14B:
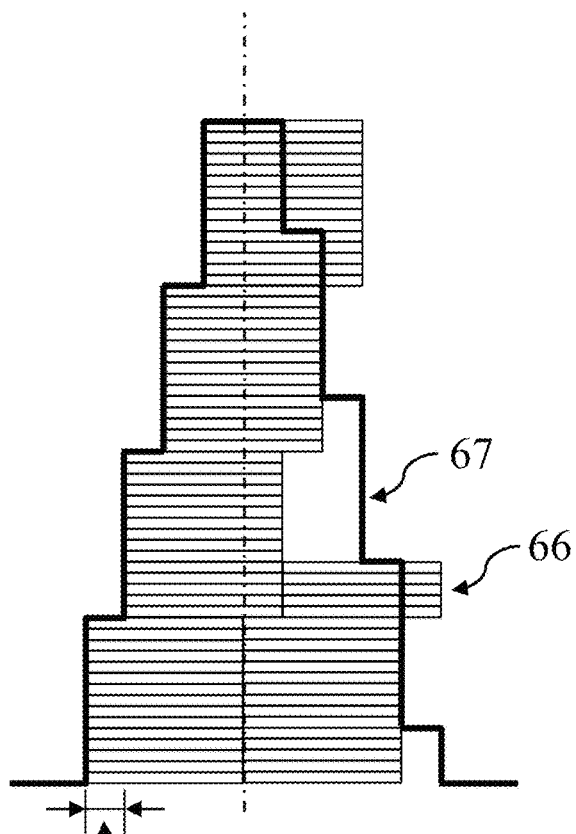
FIGS. 14B,C illustrate the fine adjustment of the position of one edge (FIG. 14B) or both edges (FIG. 14C) of the line of FIG. 14A via suitable modifications of the dose levels corresponding the exposure spots.
Figure 14C:
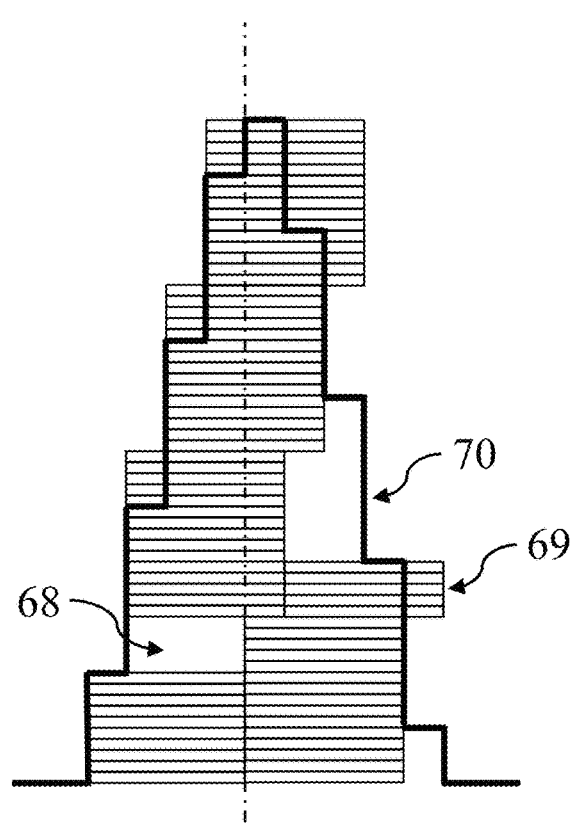

FIGS. 14A, 14B, and 14C show intensity profile diagrams illustrating how the multi-beam exposure methods illustrated here can achieve a fine positioning of structure feature with resolution smaller than the grid size. In the intensity profile diagrams, like those of FIGS. 14A-C, the discrete dose levels are visualized as rectangles 64 of uniform height, piled up in a "brick-layer" arrangement; of course, this "brick-layer" depiction is only symbolical and intended to facilitate interpretation of the drawings.

FIG. 14A shows a dose level histogram, for the example of a line of 30 nm width exposed by means of a 4 bit (i.e., 15 dose levels per spot) exposure in a Quad Grid with a beam spot size of 20 nm width. The grid size 62 is ¼ of the linear size of the exposure spots, which are symbolized as rectangles piled up in a "brick-layer" arrangement, and the resulting dose level distribution 65 is outlined as a bold line.

The line width can be made smaller or larger in very fine steps, which are smaller than the grid size, in this case the Quad Grid size 62. Reducing the line width can be achieved by lowering the dose level of the outermost exposure spots and/or omitting exposure spots (the latter when the reduction is at least about one half of an exposure spot size). Increasing the line width can be achieved by enhancing the dose level of the outermost exposure spots and/or, in particular when the maximum dose level has been reached, by adding an additional, preferably overlapping, exposure spot. The latter aspect is illustrated in FIG. 14B: an exposure spot 66 having a defined dose level is added, resulting in a dose level histogram 67 for the line with larger width compared to 65. By combining these effects of decreasing and increasing on either side, there is also the possibility to shift the line position in very fine steps. FIG. 14c illustrates a shift of the line without changing the width, which is achieved by removing dose levels from spot 68 and adding dose levels from spot 69, resulting in the dose level histogram 70 which corresponds to a line shifted to the right as compared to the line of FIG. 14A.

The intensity profiles of FIGS. 14A-C are shown along the X direction of the target plane. It is straightforward to extend the multi-beam exposure methods illustrated here to lines along other directions as well, and fine positioning can be achieved for lines at any angle on the target plane.

Figure 15A:
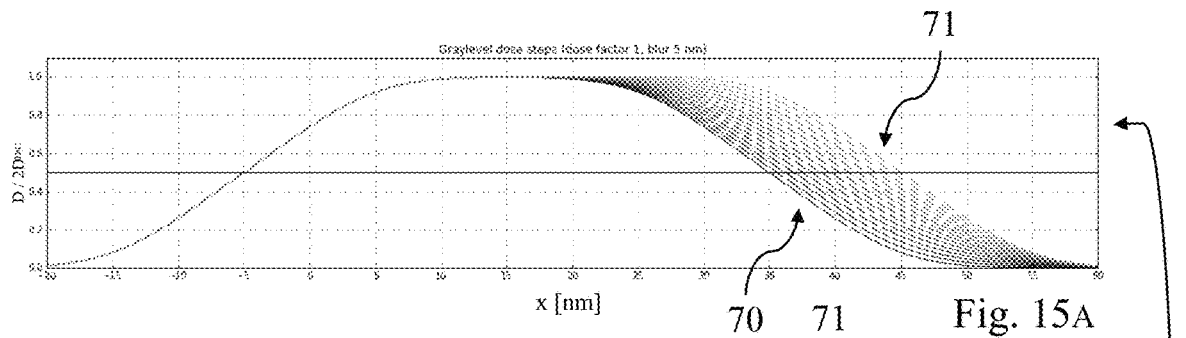
FIGS. 15A-C illustrate edge shift as a result of changing the dose of the right-hand edge pixel through the scale of gray-levels from 0 to 100%; three different cases relating to different parameters of exposure are shown, namely.
Figure 15B:
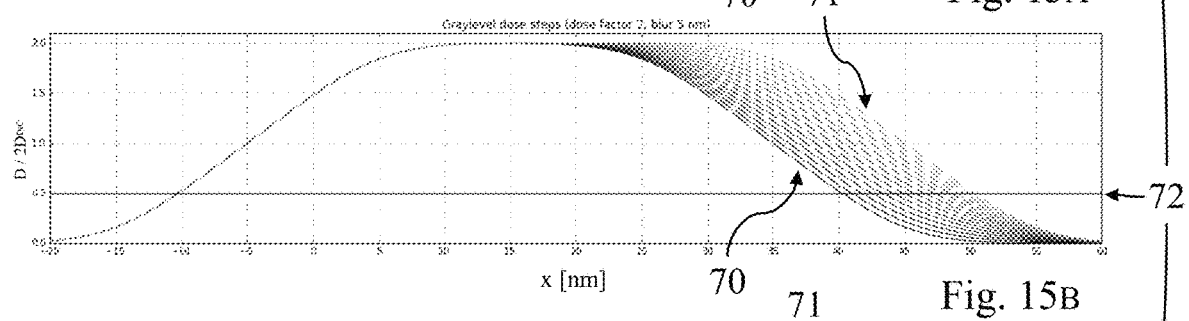
Figure 15C:
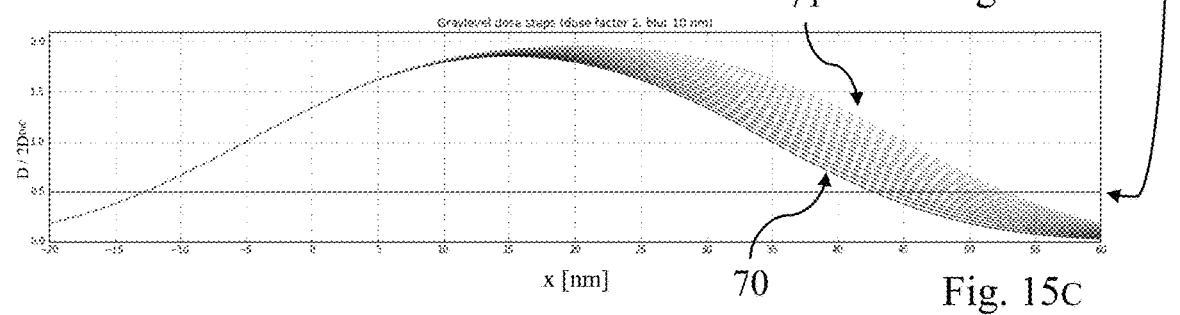

FIGS. 15A-C illustrate edge shift, or more exactly, how changing the dose of the outermost pixel causes a corresponding change in the dose profile. In all three Figures, results of simulations for the profile of the dose D as function of the coordinate x are depicted, based on a "Double Grid" exposure mode with 16 gray-levels, where FIG. 15A relates to a line exposed at a dose factor (i.e. the assigned dose relative to double "dose-to-clear" $2D_{DrC}$) of 1 with a 1-sigma beam blur of 5 nm; FIG. 15B, a dose factor of 2 with a blur of 5 nm; and FIG. 15C, a dose factor of 2 with a blur of 10 nm. For each of the set of curves shown in FIGS. 15A-C, the gray-level of the rightmost exposure position (pixel) is gradually increased from zero dose (dose profile 70) to full dose (dose profile 71) by one gray-level (1/15 of the maximum dose). The resulting exposed line width is given by the distance between the respective intersections of the dose profiles with the dose-to-clear level 72. These figures demonstrate that the edge shift is almost a linear function— albeit only approximately—of the gray value at the "edge pixel", when the gray value being varied between the zero (70) and full (71) settings; they also demonstrate that the dose factor (i.e. maximal dose relative to the double "dose-to-clear") and the 1-sigma beam blur influence both the absolute exposed line width as well as the non-linear behavior of how the line width changes for varying gray value at the "edge pixel".

Data Path

Figure 12:
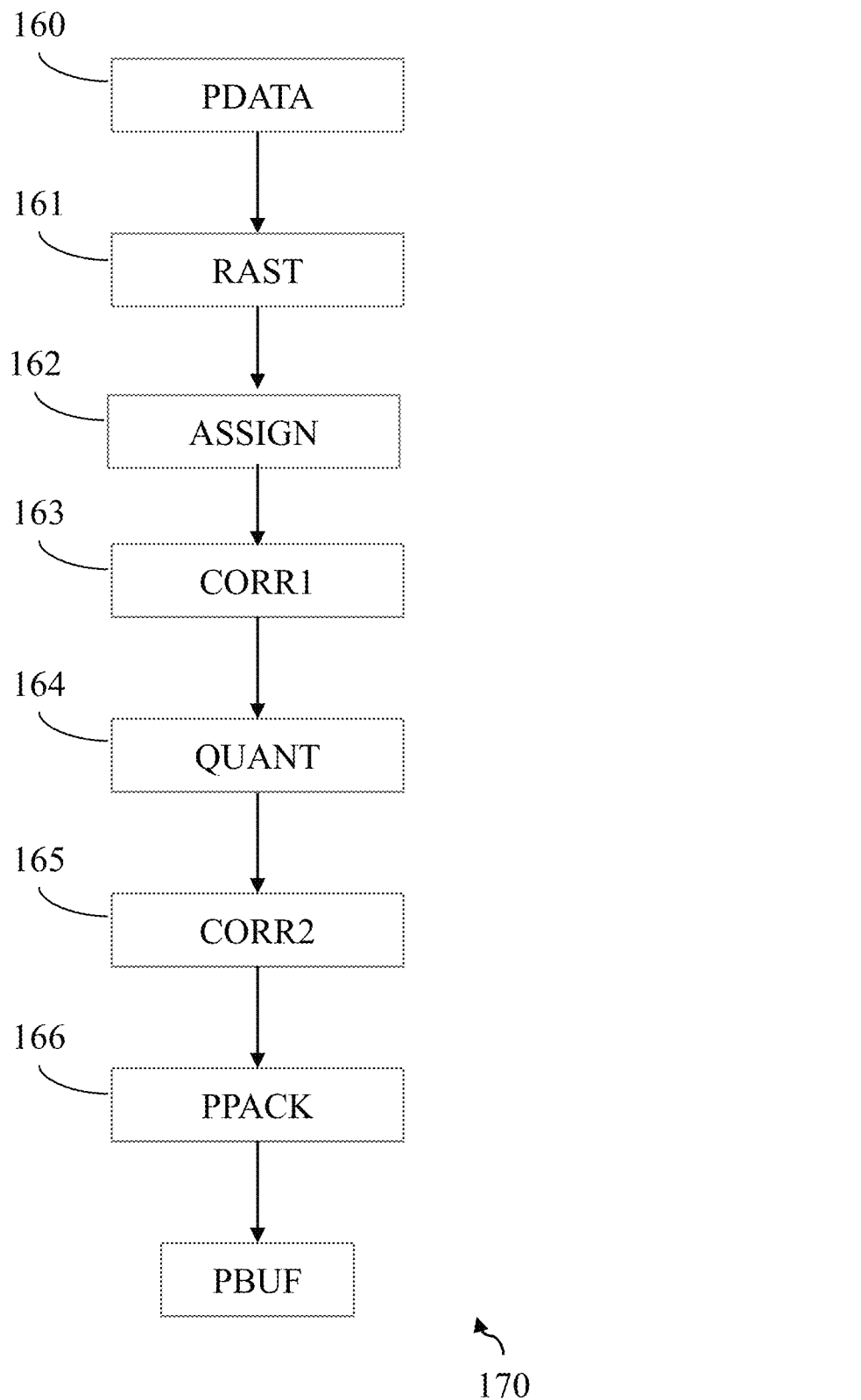
FIG. 12 a flow diagram illustrating the "Data path" of the data preparation for a pattern.

The part of the processing system 18 of the writer tool (FIG. 1) that converts the patterns to be written to beamlet dose assignments (as described above), which can be used in the writing process, is referred to as "Data path" system. FIG. 12 shows a flowchart of the data path 170 in the context of the invention. The data path is preferably performed in real time; in a variant, part or all of the calculations of the data path may be performed in advance, for instance in a suitable computer.

The complete pattern image comprises a vast amount of image data, which is why for efficient computation of those data a high-speed data path that generates the pixel data to be exposed, preferably in real-time, will be suitable. The pattern to be exposed is typically described in a vector format, e.g. as a collection of geometries like rectangles, trapezoids or general polygons, which typically offers better data compaction and therefore reduces the requirements on data storage. The data path therefore consists of three major parts:

a vector-based physical correction process (step 160),
rasterization processes to translate the vector to pixel data (steps 161 to 164), and
buffering of pixel data for temporary storage for the writing process (steps 165 and 166).

The data path starts upon being supplied a pattern PDATA to be exposed at step 160. In step 160, generally, the pattern PDATA to be exposed is split into a large number of small data chunks, possibly with geometric overlaps. Corrections that can be applied in the vector domain (e.g. proximity effect correction) may be carried out to all chunks independently, possibly in parallel, and the resulting data is sorted and coded in a way to improve computation speed of the following steps. The output is a collection of chunks where all chunks contain a collection of geometries.

Stage 161: Rasterization RAST. The geometries of every chunk are converted into rasterized pixel graphics. In this step, each pixel is assigned a floating-point gray scale intensity depending on the geometric overlap of the corresponding surface of the raster-grid cell with the pattern to be exposed, i.e. the entity of all associated chunks. In state-of-the-art solutions this floating-point intensity represents the ideal physical exposure dose to be delivered onto the target at the respective pixel location. In more detail, every pixel that is completely inside a geometry is assigned the maximal intensity, whereas the intensity of pixels that crosses an edge of a geometry is weighted by the fraction of the area of the pixel that is covered by the geometry. This method implies a linear relation between the area of the geometry and the total dose after the rasterization.

Stage 162: Pixel-to-beamlet assignment ASSIGN. In this step, given a particular write sequence, it is determined which pixel will be written by which beamlet.

Stage 163: Pixel based corrections CORR1. In this step, all corrections that can be applied in the pixel domain are performed. These corrections comprise compensation of deviations from a uniform current density of the beam 50 over the aperture field (as described above and in U.S. Pat. No. 9,495,499 of the applicant) and/or correction for individual defective beam deflectors in the DAP 30 (as in US 2015/0248993 A1). Pixel based corrections are realized by modifying the floating-point intensity of each individual pixel. This is being done with respect to the Pixel-to-beamlet assignment of Stage 162, which makes it possible to define and apply a compensation dose-factor q (or, equivalently a dose-shift s) for each pixel depending on by which beamlet it is written, and/or by which beamlets the neighboring pixels are written.

Stage 164: Quantization QUANT. The quantization process converts the possibly corrected, floating-point intensity of each pixel into a quantized (or equivalently 'discrete') gray level, given a predetermined gray value scale.

Stage 165: Further optional pixel based corrections CORR2 in the gray-level pixel data domain may be applied (not part of the present invention).

Stage 166: Pixel packaging, PPACK. The pixel image obtained from stage 164 is sorted according to the placement grid sequence and sent to a pixel buffer PBUF which is provided in the processing system 18 of the writer tool (FIG. 1). The pixel data is buffered until a sufficient amount of data, typically at least the length of a stripe, is present, which triggers the exposure of the stripe (see FIG. 7). The data is taken out of the buffer during the writing process. After the stripe has been written, the process described above starts anew for the pattern data of the next portion of the exposure region, such as the next stripe.

Grid Positioning Nonlinearity

In state-of-the-art solutions of the applicant, as described above a linear relationship between the dose of the outermost pixels and the achieved feature size is assumed for dose assignment. If the dose factor is close to 1 (that is, if the maximal dose used in a feature is close to $2D_{DrC}$), the corresponding linearization error is very small and may be neglected in many cases; it may, however, become significant if the dose factor strongly deviates from 1.

This is illustrated by simulation results for line features, which are shown in FIG. 16. The dashed/dotted lines in FIG.

16A show, for the case of 5 nm 1-sigma blur, "Double Grid" write strategy and a variety of dose factors, the change of line width, dCD, (given in units of the pixel size) as functions of pixel dose d (in units of the maximal dose) for the pixel at the line edge (outermost pixel). When using the double "dose-to-clear" (dose factor 1; dashed line), the relationship is almost linear, and the resulting error is less than 2% of a pixel width; the ideal linear relationship between outmost pixel dose and line width increase is given as a solid line for reference. However, for dose factors 2 and 3 (dashed-dotted and dotted lines) the deviation from linearity becomes significant, as the maximal error increases to 9% and 13% of a full pixel size, respectively. The linearization error $\varepsilon_{CD}$=dCD−1 is shown in FIG. 16B for the data of FIG. 16A. Especially for large dose factors, the linearization error may reach a critical value in the range of several nm.

Figure 19A:
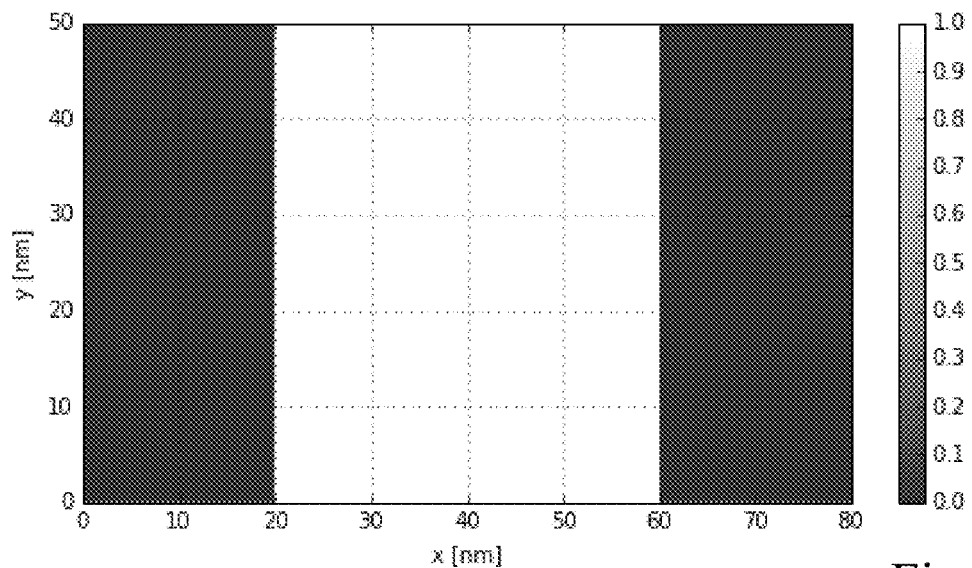
FIG. 19A,B shows, in the pixel grid domain, line features aligned parallel to the y axis, where
Figure 19B:
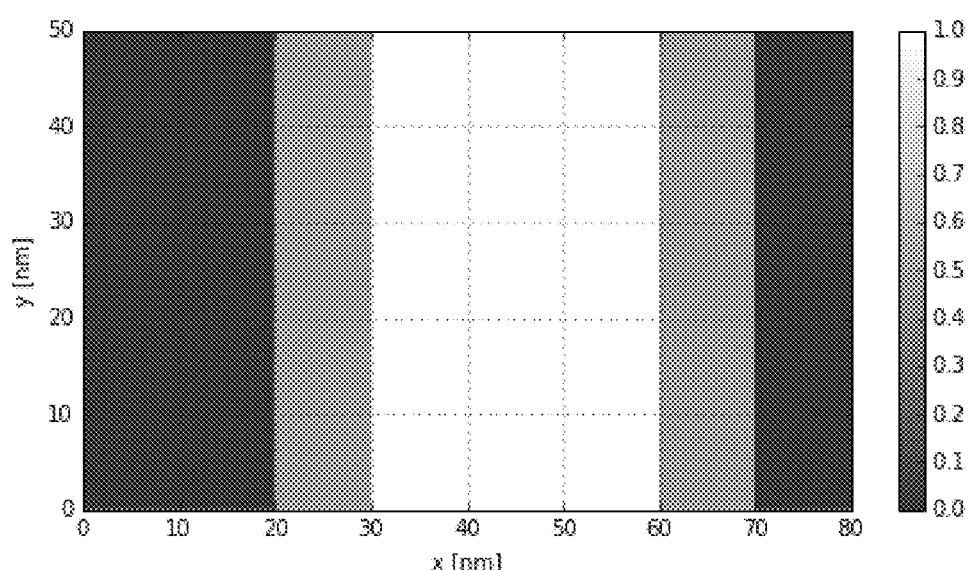
FIG. 19B shows a line feature shifted by half a pattern pixel to the right.

In particular, this non-linear linearization error may lead to variation of the effective feature size depending on the position of the feature relative to the pattern pixel grid. For instance, if a line with edges aligned with the pattern pixel grid (as depicted in FIG. 19A, with pattern pixel size 10 nm and line width 40 nm) is shifted a half pattern pixel to the right, the outermost pixels on both sides of the line will be assigned half of the maximal dose by the rasterizer, as shown in FIG. 19B. If the relationship between the dose of the outermost pixel and effect edge placement is actually linear or close to linear (i.e. if the dose used is close to $2D_{DrC}$), the shift of the left edge in FIG. 19A to the right will exactly or almost compensate the shift of the right edge in FIG. 19A to the right (with both edges shifting a half pixel size, independent of the dose factor used). Thus, the critical dimension is not affected by the shift. If, on the other hand, a dose strongly deviating from $2D_{DrC}$ is utilized, this is no longer the case. For instance, in the context of FIG. 16B, when using a dose factor of 2, both edges will be placed approximately 0.9 nm farther on the outside than expected when assuming linear behavior, adding up to a total change of critical dimension of 1.8 nm due to the shift of the line edges relative to the pattern pixel grid.

Figure 17A:
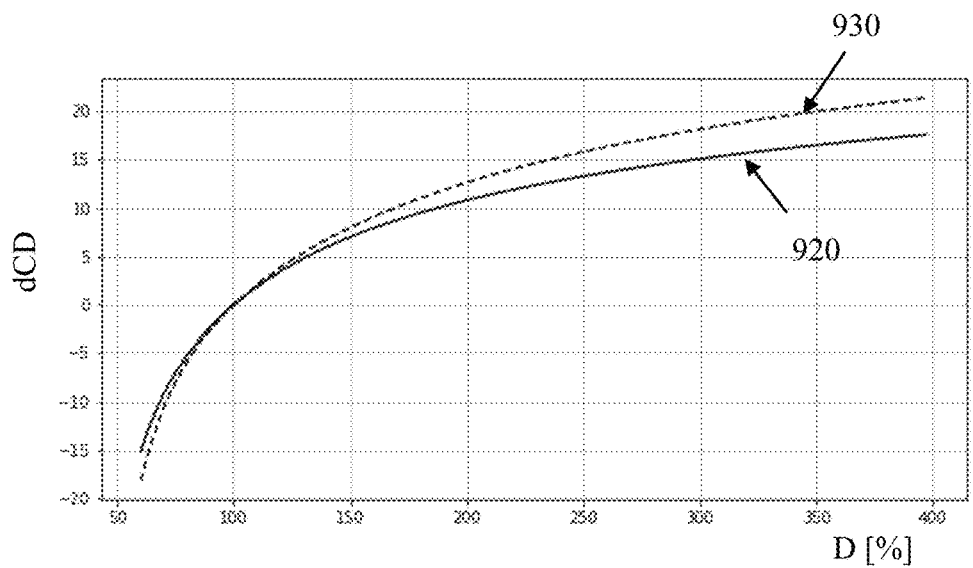
FIG. 17A shows the change dCD of the critical dimension for an on-grid feature and a feature whose edges lie in the middle between two physical grid points, respectively, as a function of the dose factor D.
Figure 17B:
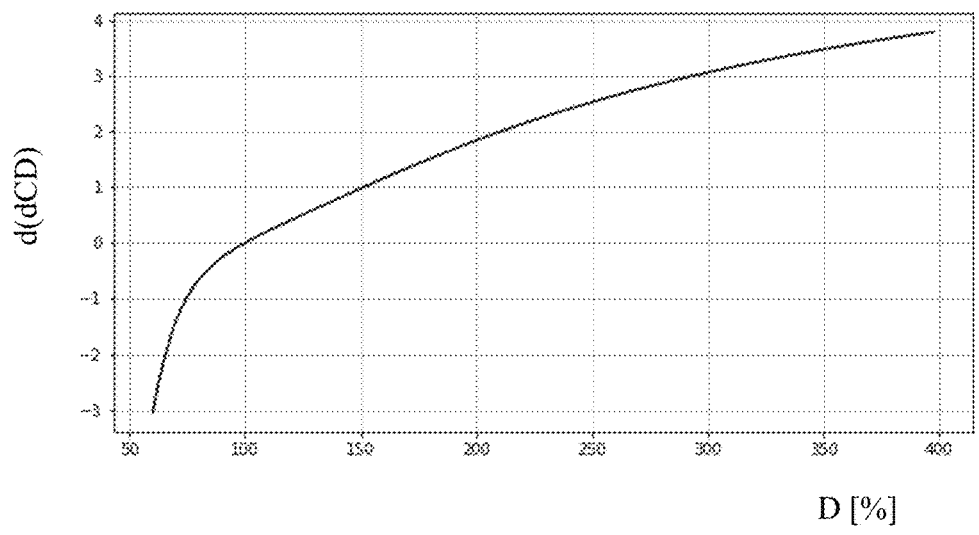
FIG. 17B shows the difference d(dCD) between the two lines of FIG. 17A.
Figure 18:
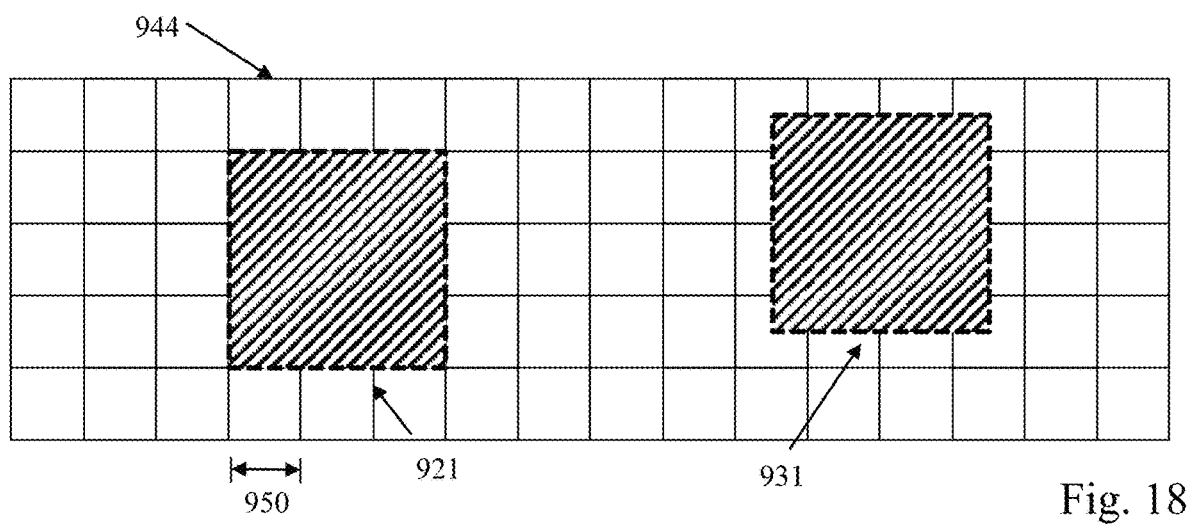
FIG. 18 illustrates the locations of two features corresponding with the two lines of FIG. 17A, respectively.

This effect may strongly affect the critical dimensional uniformity (variation of critical dimension), a metric which is often more important than the absolute change of critical dimension resulting from a change of dose factor (which is often seen as a process parameter and adjusted as required). Note that the largest error is generally attained close to a half dose of the outermost pixel, which is the linear dose assignment when a line edge lies in the middle of two physical grid points (as is the case, for instance, in FIG. 19B). FIG. 17A shows the change dCD (in nm, corresponding to units of pixel size times 10) of the critical dimension 920 of a feature whose edges coincide with the physical grid ("on-grid") and that of the critical dimension 930 of a feature whose edges lie in the middle between two physical grid points ("off-grid"), as functions of the dose factor D used in the feature, both for the case of the "Double Grid" multi-beam exposure mode and a 5 nm 1 sigma blur. For better clarity the corresponding features 921, 931 are depicted in FIG. 18 (note that both features are of same size), where the physical grid 944 of the Double Grid mode is indicated (also cf. FIGS. 6A and 8A). Note that the edges of the feature 921 coincide with the physical grid, which under dose variation scales according to the line 920 of FIG. 17A; whereas the edges of the feature 931 are offset relative to the grid by half the pitch 950 (which here, for instance, is 10 nm for a beamlet size of 20 nm and o=2, and thus the offset of 931 relative to the physical grid is 10 nm/2=5 nm). For simplicity the same offset in both directions X,Y is assumed in this example. FIG. 17B shows the difference between the two lines of FIG. 17A, i.e., the difference d(dCD) between the change of critical dimension dCD by changing the dose of both features (simultaneously): the difference in feature size d(dCD) resulting from the change of location relative to the grid is only zero for the dose which corresponds to a dose factor 1 (i.e. D1=$2D_{DrC}$) which in FIGS. 17A+B correspond to the absolute dose value 100%. Consequently, under- or overdosing can, in combination with the overlapping pixels write mode, lead to a degradation of the CD uniformity since features may scale differently depending on their placement relative to the physical grid. As can also be seen, this CD error scales in a monotonic way with the amount of deviation from $2D_{DrC}$.

Non-Linearity Correction

The present invention envisages a modification of the data path that corrects critical dimension errors due to Dose/CD-nonlinearity effects as described above. In particular, such a correction allows a shift of the position of the feature 921, 931 (collectively referred to by the symbol t) to be exposed relative to the pattern pixel grid while avoiding a significant change of feature size. The change of feature size is most pronounced for axial features, i.e., polygons for which all line segments are aligned with the directions of the coordinate axes, since for such structures, the position of the feature edges relative to the pixel grid is constant. Therefore, a correction procedure is presented which focuses on axial features; it is noted, however, that the correction procedure can also be utilized for oblique edges at a small angle with the pixel grid (for which the error may also be significant) by approximation with axial edges.

Figure 16A:
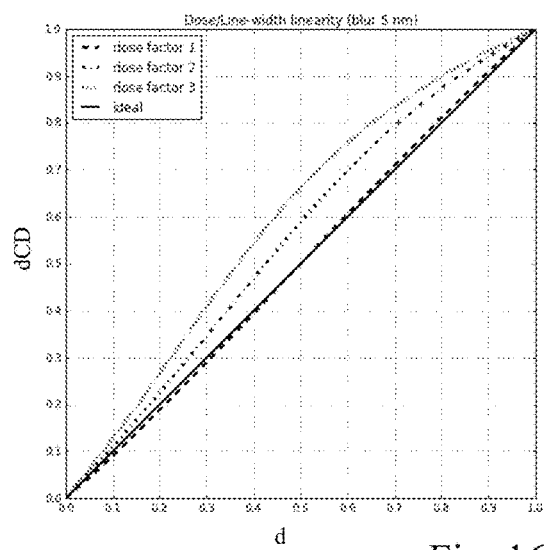
FIG. 16A shows the change of line width dCD as function of the pixel dose d of the pixel at the line edge, at various levels of dose factor as indicated.
Figure 16B:
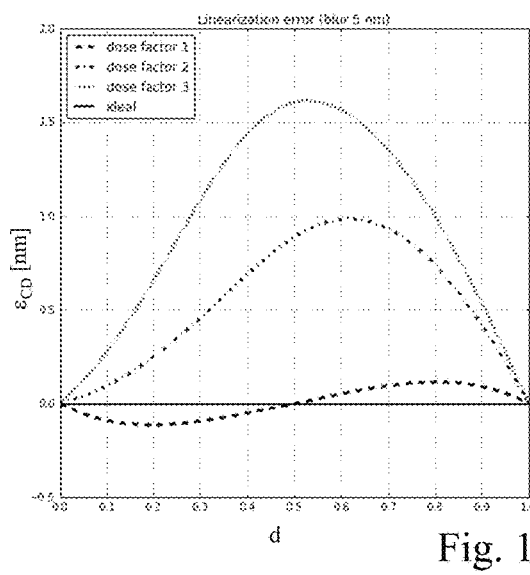
FIG. 16B illustrates the linearization error $\varepsilon_{CD}$=dCD−1 for the data of FIG. 16A.

The correction procedure as implemented in the present embodiments uses the inverse function of a CD-change function as, for example, depicted in FIG. 16A, to revert the machine back to linear behavior. In the following, this function is symbolized as $f_{\xi(\Phi)}(d)$, where 0≤d≤1 denotes the relative dose (relative to the maximal dose D of the feature) of a pixel intersecting a line edge, $\xi(\Phi)$ a set of parameters influencing said relationship between pixel-dose and CD-change, such as dose factor, beamlet blur, orientation of the feature edge, dose background, proximity-effect factor, interlocking strategy (e.g. "double-grid" or "quad-grid"); thus, $f_{\xi(\Phi)}(d)$ describes the resulting edge shift or change of critical dimension (CD) relative to a dose level 0, in units of pixel sizes (in the drawings, the pixel size is denoted by the symbol ps).

In one embodiment of the invention, the correction is implemented in the rasterization (RAST) stage of the data path. In state-of-the-art solutions of the applicant, as described above, the relative dose d a pixel p is assigned when writing a structure Φ is determined by calculating the fraction of the area of the pixel covered by the structure, as given by the formula $$d = \frac{\text{area}(p \cap \Phi)}{\text{area}(p)},$$

where area(S) denotes the area of the shape S (S is either p or p∩Φ), and the symbol ∩ denotes the intersection of two sets or shapes. An illustration of this geometric relation is depicted in FIG. 24A, where the square denotes the outlines of the pixel p and r denotes the coordinate describing the position of the structure edge (thick line) of the structure Φ. Note that in FIG. 24A the structure Φ is located to the left of the edge (hatched area, including the cross-hatched part of the pixel area). FIG. 24B depicts the functional relation of the area of the intersection, area(p∩Φ), as function of the coordinate r. Here, $r_1$ denotes the coordinate where the area reaches the full value area(p), which is equivalent to a relative dose value of d=1. In the embodiment of the invention, however, the above relation is refined in that a different dose assignment $\bar{d}$ is utilized, which is given by the expression $$\bar{d} = f_{\xi(\Phi)}^{-1}(d) = f_{\xi(\Phi)}^{-1}\left(\frac{\text{area}(p \cap \Phi)}{\text{area}(p)}\right), \quad (1)$$

In other words, instead of taking the linear dose assignment d, a nominal dose assignment d is chosen in such a way that the shift in edge placement due to the added dose (as predicted by the function $f_{\xi(\Phi)}$) matches the relative position of the edge in the vector structure. For instance, when moving the edge in the vector representation of the structure 2 nm to the outside, the exposed edge will also be moved 2 nm to the outside, thus recovering a linear behavior.

Figure 20:
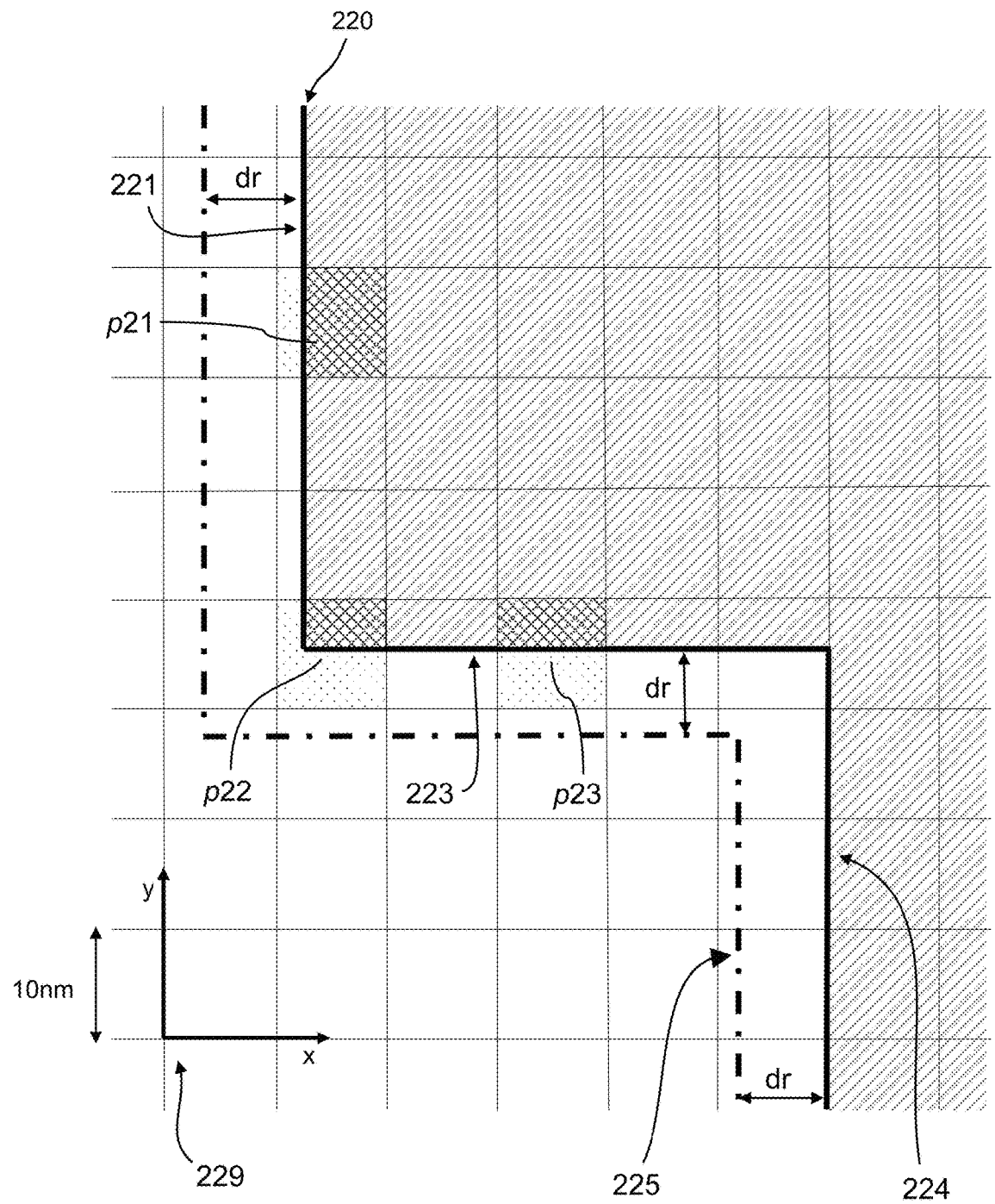
FIG. 20 illustrates a non-linearity correction procedure, operating in the pixel domain according to a first embodiment of the invention.

An example of the procedure is given in FIG. 20, where 20 nm beamlets with 5 nm blur are placed with a "Double Grid" writing strategy, over a pattern pixel grid 229 having a pixel size of 10 nm. A vector structure (shown hatched, delimited by an edge indicated by solid line 220) with an assigned dose factor of 3 is rasterized with a non-linearity correction as described above. The pixels intersected by the edge vertical portion 221 (such as pixel p21) are assigned a relative linear dose of d=0.75 of the maximal dose 3 (since the intersection of pattern and pixel is 75% of the pixel size), except for the corner pixel p22, which is assigned a relative dose of d=0.3. Using the curve for dose factor 3 of FIG. 16A, the appropriate corrected pixel doses are $\bar{d}$=0.59 for the pixels along the edge vertical portion 221 (which effectively shifts the latter to its intended position of 0.75 pixels to the left of the pixel grid) and $\bar{d}$=0.22 for the corner pixel p22 (which is only an approximate correction). Similarly, the pixels intersecting the edge horizontal portion 223 (such as pixel p23) are assigned linear doses of d=0.4 and hence corrected doses of $\bar{d}$=0.23 (which shifts this horizontal portion downward 0.4 pixels relative to the grid for the given exposure parameters). Since the third edge portion 224 is aligned with the pixel grid, no correction is performed to the pixels in its vicinity. It will be appreciated that due to overdosing, the corrected line 225 obtained after exposure (dash-dotted line, the depiction is idealized at the positions of the corners since exposed corners will generally be rounded) is intended to have a uniform offset of about dr=8 nm from the pattern edge, independent of the position relative to the pattern pixel grid.

Figure 21:
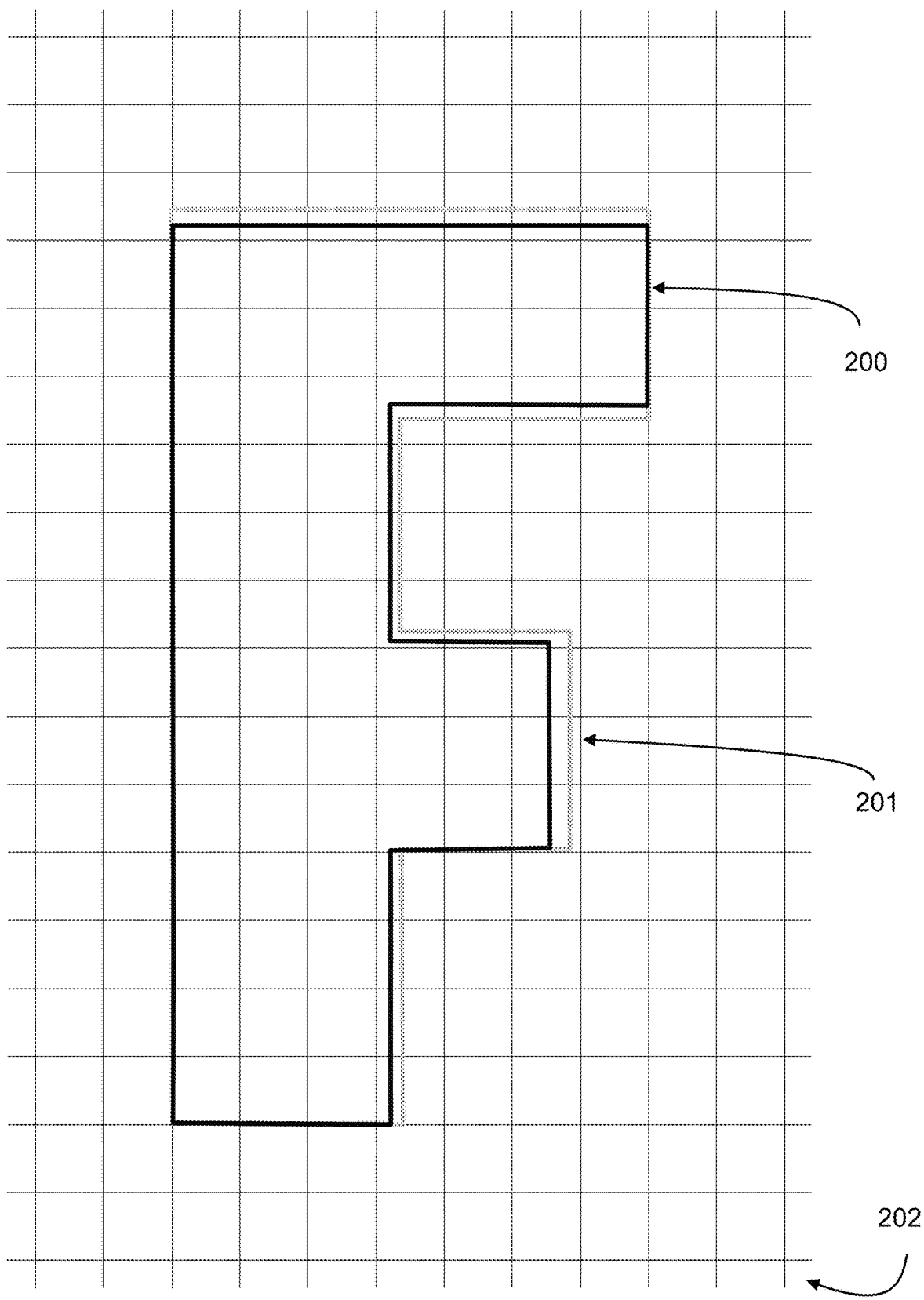
FIG. 21 illustrates the non-linearity correction operating in the vector domain according to a second embodiment.

In another embodiment of the invention, the correction is performed in the vector domain, that is, in PDATA stage of the data path (FIG. 12). Rather than changing the dose assignment in the rasterizer, the edges of the vector structures are modified depending on their position (and orientation) relative to the pattern pixel grid such that their assigned linear dose corresponds to a corrected dose $\bar{d}$, which is, e.g., determined using the above formula. An illustrative example is given in FIG. 21. Depending on their position relative to the pattern pixel grid 202 and exposure parameters ξ, the constituent line segments of the polygon 200 are shifted to obtain the corrected polygon 201. In a suitable embodiment of the invention, the correction is performed using the function $f_{\xi(\Phi)}$ described above. Given an edge of a vector structure Φ, first its offset dx relative to the pixel grid (in outward direction of the vector structure) is determined. Then, the edge is repositioned to a corrected pattern edge position $\overline{dx}$ (relative to the pixel grid), and this corrected position is used as a nominal edge position during writing of the structure in such a way that the (actual) exposed edge is placed at the desired edge position dx (as predicted by the function $f_{\xi(\Phi)}$). That is, the corrected edge position $\overline{dx}$ is given by $$\overline{dx}/ps = f_{\xi(\Phi)}^{-1}(dx/ps). \quad (2)$$

This relation (2) has, apart from the normalization of the position values to the pixel size ps, the identical structure as the relation (1) used above for the correction during the rasterization stage.

Figure 22:
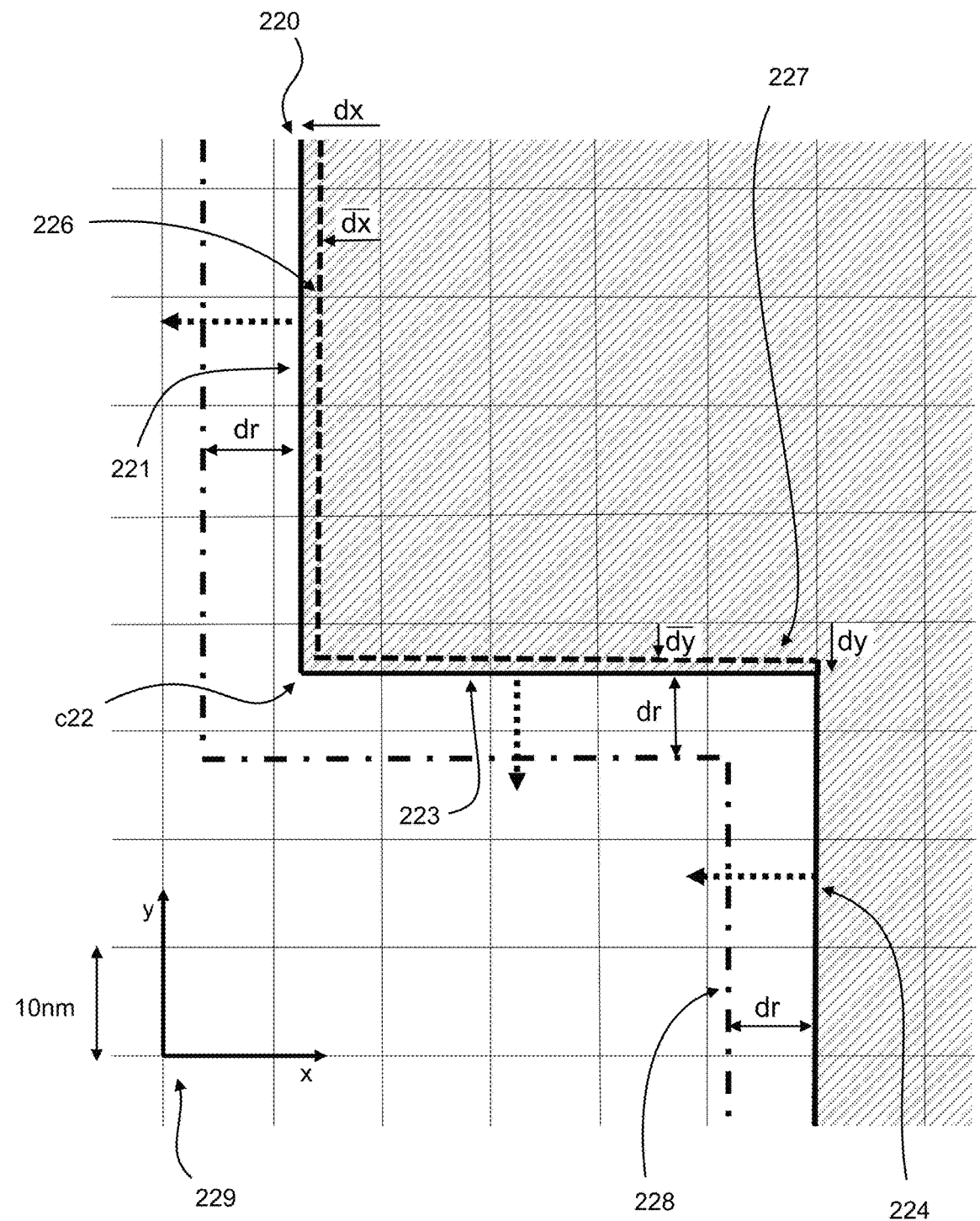
FIG. 22 illustrates the non-linearity correction in the vector domain for the feature structure of FIG. 20.

An example is given in FIG. 22, which uses the same setting as FIG. 20, but in this case with respect to the underlying vector structure 220, which has an assigned dose factor of 3. The edges of the vector structure 220 (outward pointing normal vectors for each edge portion are shown as dotted arrows) are corrected according to a procedure as described above. The edge vertical portion 221 has a horizontal offset of dx=7.5 nm relative to the pixel grid (all offset values are denoted with regard to the respective outward direction), which corresponds to 0.75 pixels and is there shifted to the relative position $\overline{dx}$=5.9 nm according to the curve for dose factor 3 in FIG. 16A, resulting in a (corrected) edge portion 226. Likewise, the edge horizontal portion 223 is moved from dy=4 nm (i.e. 0.4 pixels) to the corrected relative position at edge portion 227 having $\overline{dy}$=2.3 nm. The edge portion 224 overlaps with the pixel grid (dx=0), so it remains unchanged. As in the pixel-based correction presented in FIG. 22A, the corrected line 228 obtained after exposure will have an intended uniform offset of about dr=8 nm from the edge portions of the vector structure 220 independent of the position relative to the pattern pixel grid, as compared to the original pattern edge due to overdosing. It is remarked that the corner c22 is handled in this case (FIG. 22) in a different manner as compared to the correction during rasterization (FIG. 20), so the corresponding corner of the exposed corrected line 228 will be curved in a different manner (not shown in the figures).

A further aspect of the present invention relates to pattern edges that are sloped relative to the raster grid, in particular having a significant slope or having small angle of slope while being sufficiently long. The inventors noticed that with this type of pattern features, the non-linear placement effect may lead to a another type of error, since the position of the edge relative to the pixel grid changes along the course of the edge. Specifically, this may cause a distortion of a nominal straight edge into a slightly curved line. FIGS. 25A-D illustrate the effect of the angle of slope of a pattern edge upon the placement shift. More specifically, FIG. 25A shows the CD-change functions $dCD=f_\xi(dx)$, for a variety of slopes relative to the pattern pixel grid as function of the position of the edge relative to the grid, dx, for a scenario using the basic setting of 20 nm beamlets, "Double Grid" writing strategy and 5 nm beam blur, with a uniform dose factor of 3 (as with FIG. 16A,B). The values of the angle refer to the angle of slope of the pattern edge with respect to a raster principal direction, in this case the c-coordinate ("horizontal" direction). FIG. 25B shows the corresponding linearity error $\varepsilon_{CD}=f_\xi(dx)-dx$. More in detail, FIG. 25A shows how the exposed edge is shifted, with the shift measured at multiple positions along a 300 nm line edge, for exemplary values of slopes (1 mrad, 10 mrad, 25 mrad, and 785 mrad=45°), when the pattern edge is moved by up to one pattern pixel (i.e., by up to 10 nm). the values of dCD shown in FIG. 25A represent the displacement of the exposed edge averaged along the line, relative to a base position (aligned with the grid in the center in edge direction). FIG. 25B shows, as mentioned, the corresponding averaged linearization errors, i.e., the deviation from the ideal situation where the exposed edge is shifted exactly like the pattern edge. FIG. 25C indicates the 1-sigma variation of the displacement along the line, where the displacement is measured perpendicular to the respective line direction. FIG. 25D shows the corresponding 1-sigma variation of the linearization error.

From the FIGS. 25A-D the following observations will become clear: The placement non-linearity of the edge angled with 1 mrad relative to the horizontal grid lines (corresponding date are represented as solid curves) can be corrected easily by shifting the whole line, since the corresponding 1-sigma variation (solid lines in FIG. 25D) along the line is negligible. In this context it is noteworthy to point out that the non-linearity shown in FIGS. 25A+B looks more dramatic as it will be in many realistic cases, since the abscissa length in FIG. 25A+B is "compressed" by a factor given by the arctangent of the angle (e.g., arctan(1 mrad) ≈0.001) as compared to the actual length of the edge. Thus, this on-linearity effect will only be for edges of considerable length. The line edge angled with 10 mrad relative to horizontal (corresponding data in dotted curves) still has significant variations of average width along the line; however, it also exhibits a significant variation along the line (hereinafter referred to as "line edge roughness", LER) in the order of 0.3 nm 1-sigma. For the edge sloped with 25 mrad (dotted curves; similar results are expected for edges with higher angle relative to the grid), most of the linearity error is manifested as LER with the average deviation from linear behavior when shifting the edge relatively low. Note that for edges having a high angle relative to horizontal (such as the dash-dotted line with an angle of 785 mrad=π/4 rad=45°) both the average error and the variation are comparatively low, which means that in favorable implementations of the invention, for all line edges only the grid position relative to either the x- or the y-coordinate lines has to be corrected (if the angle is below a chosen threshold).

Figure 26A:
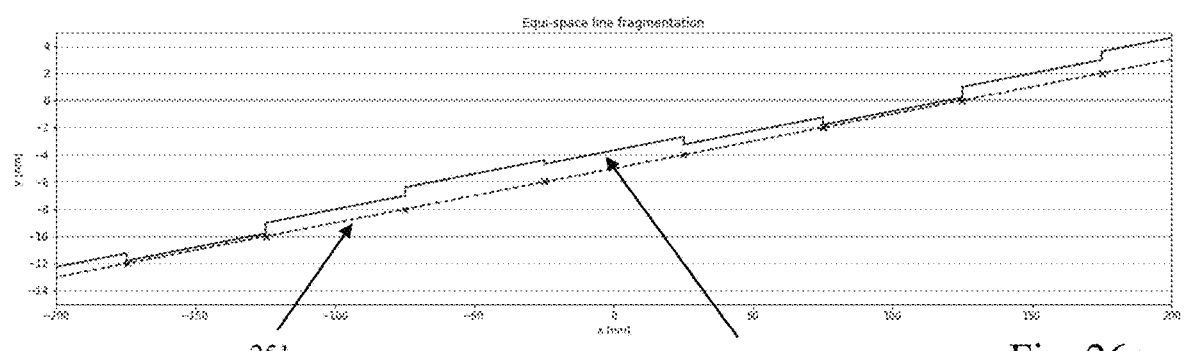
FIG. 26A+B illustrate an exemplary approach to correct the positioning error for a sloped edge, by dividing the edge into multiple edge segments, which are e.g. evenly spaced (FIG. 26A) or have reduced widths where the variation of the positioning error is higher (FIG. 26B).
Figure 26B:
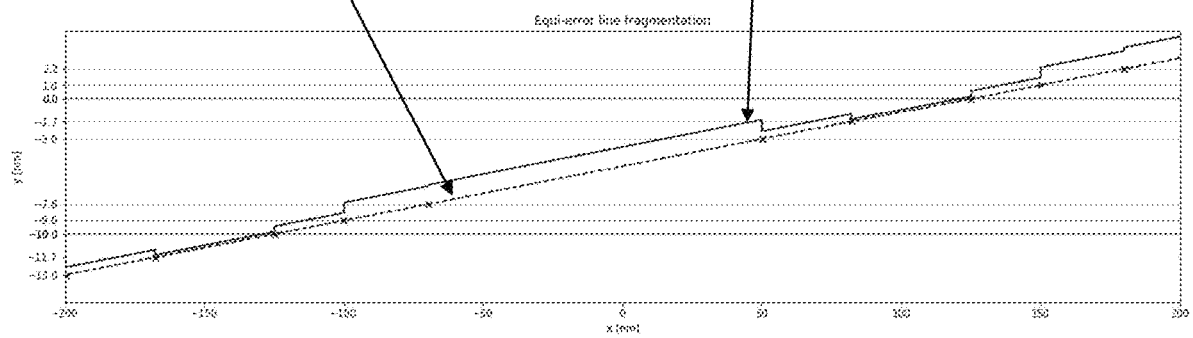

In favorable embodiments of the invention, the above effect on LER may be reduced by introducing artificial cuts into a pattern edge to be corrected, so as to "portion" the edge into a plurality of segments, and then shifting/correcting the edge segments. In one implementation, the pattern edges are portioned into equal segments with lengths in the order of e.g. 30 to 100 nm, corresponding to a few widths of pixels (e.g. about 3 to 10 pixel widths), and then the position of the pattern edges in the segments is corrected individually, using the inverse of the CD-change function $f_\xi$. The parameter vector $F\xi(\Phi)$ may include the line angle and segment length; however, it is also possible to approximate with the inverse of the equivalent function $f_\xi$ for axial lines instead, especially where the angles are small or the segments are short enough so the error of this approximation is below a given threshold. In another implementation, it may be advantageous to introduce a set of auxiliary grid-points along to the general direction of the pattern edge, such as the ones shown in FIG. 26A,B. The pattern edge is then divided at the positions of intersections with the subpixel grid. The generated segments are then shifted as described above. FIG. 26A illustrates an example of an equispaced subpixel grid, with a portioning into segments of equal size along a pattern edge segment; it will be clear that a suitable choice of the segment size may vary with the angle of the pattern edge relative to the pixel grid. In another example, pictured in FIG. 26B, the auxiliary dividing points are chosen such that the placement error and line edge roughness of the shifted line segments is (approximately) equal, e.g., by decreasing the subdivision size where the positioning error changes rapidly (around positions of the pattern pixel grid), by splitting using error plots $f_\xi(dx)-dx$ (cf. FIG. 16B, FIG. 25B), or by optimizing the subpixel division positions using computer simulations. In both FIGS. 26A and 26B, the nominal pattern edge is shown as a dashed line 251 (with the pattern to be exposed above the pattern edge), the positions of the auxiliary points (grid-points/dividing points) are marked with crosses. In both examples, the subsegments were shifted in an inward direction orthogonal to the pattern edge direction according to the inverse CD-change function $f_\xi^{-1}$ for horizontal lines, evaluated at the average vertical position of the edge segment, resulting in a corrected pattern edge 252.

In a different embodiment of the invention, the pattern edges or pattern edge segments are not shifted by using the inverse $f_\xi^{-1}$ of the CD-change function $f_\xi$, instead using a shift of the pattern edge by the reverse linearity error $-(f_\xi(dx)-dx)$ in a first-order approximation. This approximation is made under the assumption that the linearity correction applied to the pattern affects the exposed edge linearly.

In a further suitable aspect of the invention, the function $f_\xi$ (and its inverse) may be represented by a table, or a number of tables as illustrated in FIG. 23 (tabulated representation). FIG. 23 shows an example of three tables which can be used for numeric determination of the non-linearity function, giving the function with respect to its dependence on the linear dose assignment d (or the relative position of the pattern edge in pixel sizes dx/ps) and the exposure parameters $\xi$. Such a table can be obtained, for instance, from pre-computed simulations or experimental measurements. Using this table, the dose assignment d in the rasterizer can be obtained by nearest-neighbor-lookup or interpolation of the table values for the given exposure parameters at the pixel position x and assigned linear dose. In the example of FIG. 23, the parameters are $\xi$=(dose_factor, blur), the values in the table represent $f_\xi(d)$ (or, equivalently, $f_\xi(dx/ps)$) for a variety of exposure parameters $\xi$. The table is simplified for easier understanding of the invention; in practice, it is likely that a much finer table resolution and a larger number of exposure parameters (will be utilized. If, for instance, a non-linearity correction is applied for a pixel with linear dose assignment d=0.53 and $\xi$=(2, 4), the corrected dose $\bar{d}=f_{\xi(\Phi)}^{-1}(d)$ can be obtained by a combination of table lookup (the nearest values in the column for blur 4 and table for dose factor 2 are 0.439 and 0.575) and linear interpolation giving a corrected dose of $\bar{d}$=(1−t)*0.4+t*0.5=0.47 with t=(d−0.439)/(0.575−0.439)= 0.67. For $\xi$=(2.8, 7) and d=0.2, one proceeds similarly with bilinear interpolation, that is, one first obtains as before the interpolated values $\bar{d}_2$=0.17 (table for dose factor 2, column for blur 7) and $\bar{d}_3$=0.15 (table for dose factor 3, column for blur 7), which are again interpolated resulting in a corrected dose of $\bar{d}$=0.4*0.17+0.6*0.15=0.158.

What is claimed is:

1. Method for calculating a pattern to be exposed on a target by means of a charged-particle multi-beam writing apparatus, said apparatus exposing a multitude of pixels (px) within an exposure region (r1) on the target to generate said pattern by means of a scanning stripe exposure, wherein the pattern is realized as a pixel graphic composed of a plurality of pixels defined in accordance with a raster grid on the exposure region (r1), wherein each of said pixels is represented by a geometric pixel shape located at a respective pixel position and is assigned an intensity value corresponding to a value of exposure dose to be exposed for the respective pixel, the method comprising the steps of:
  (i) providing a vector pattern as a number of pattern elements, wherein each pattern element has a respective geometric shape comprising a boundary and an interior, and wherein each pattern element is associated with an assigned dose (D), which defines a value of exposure dose to be exposed for each of said pixels within the interior of the respective geometric shape of the pattern element, and
  (ii) rasterizing the vector pattern into the pattern by calculating, for each of the plurality of pixels, respective intensity values based on the vector pattern,
  wherein a position correction for at least one edge position of a pattern element boundary is performed during one of steps (i) and (ii), said position correction including the steps of:
    determining a position value describing said edge position,
    determining a corrected position value based on the position value using a predefined non-linear function, said predefined non-linear function ($f_{\xi(\Phi)}^{-1}$) describing the inverse of the relationship between a nominal position value ($\overline{d}, \overline{dx}$), said nominal position value being used as input value during exposure of the pattern, and position (d, dx) of the pattern element boundary generated when exposed with said nominal position value, wherein said predefined non-linear function is further dependent on at least one parameter including at least one of the assigned dose of the pattern element involved and a blur of the pixels, and
    modifying the pattern to effectively shift the pattern element boundary in accordance with the corrected position value.

2. The method according to claim 1, wherein the scanning stripe exposure is configured to generate aperture images which are mutually overlapping, and the aperture images have a nominal width (b) which is a multiple of the distance (e) between pixel positions of neighboring aperture images generated on the target, the method having the additional step:
  (iii) generating, from the pattern obtained in step (ii), an exposure pattern suitable to expose the pattern by said writing process through exposure of aperture images.

3. Method for calculating a pattern according to claim 1, wherein said position correction is performed during the step (ii) of rasterizing, and wherein said position correction is performed in that, for at least those pixels whose pixel shape is crossed by a boundary of a pattern element, for each pixel the intensity value is calculated by:
  determining a position value, by determining a first area as the area of the fraction of the pixel shape covered by the pattern element whose boundary crosses said pixel shape and calculating the position value (d) as the ratio of the first area to the area of the entire pixel shape,
  determining an intensity value from the position value using a predefined non-linear function, said predefined non-linear function ($f_{\xi(\Phi)}^{-1}$) describing the inverse of the relationship between intensity value ($\overline{d}$) of a pixel, as generated by exposing such pixel with an exposure dose equivalent to the intensity value, and geometric area portion (d) of the pixel shape area of a pattern element boundary generated with such intensity value, with at least one parameter, said at least one parameter including the assigned dose of the pattern element involved, and assigning the intensity value to the respective pixel.

4. Method for calculating a pattern according to claim 1, wherein said position correction is performed during the step (i) of providing the vector pattern, and said position correction is performed in that an edge position correction is made for at least one pattern element, the edge position correction for said pattern element including the steps of:
  determining the positions (dx) of boundary segments of the boundary with regard to the raster grid,
  determining corrected positions ($\overline{dx}$) for each boundary segment as nominal edge positions based on a predefined non-linear function, said predefined non-linear function ($f_{\xi(\Phi)}^{-1}$) describing the inverse of the relationship between a nominal edge position ($\overline{dx}$) and the position (dx) relative to the raster grid when written using such nominal edge position, with at least one parameter, said at least one parameter including the assigned dose of the pattern element involved, and
  forming a reshaped pattern element, said reshaped pattern element having boundary segments which are offset in a direction perpendicular to the respective segments to locations in accordance with said corrected positions, and replacing the pattern element by the reshaped pattern element.

5. Method for calculating a pattern according to claim 1, wherein the parameters further include at least one of the ratio of the assigned dose to dose-to-clear level, beamlet blur of the pixels imaged on the target, orientation of the boundary or edge of the respective pattern element, dose background, proximity-effect factor, and density of the pixels with respect to the raster grid.

6. Method for calculating a pattern according to claim 1, wherein the non-linear function and/or its inverse function is specified through at least one set of points of support, each point of support specifying a numeric value of nominal position value and a numeric value of associated position value, at a specific value of the parameter(s) of the non-linear function, wherein said numeric values have been derived in advance from at least one of computer simulations and experimental measurements, and values of the non-linear function lying between points of support are interpolated.

7. Method for calculating a pattern according to claim 1, including a position correction for a pattern element boundary which is oriented at an angle between 0° and 45° to a principal direction (X, Y) of the raster grid,
  said position correction further including the steps of:
    portioning the pattern element boundary into two or more segments, said segment being divided at auxiliary points,
    prior to performing the position correction for each of these segments individually, wherein the position correction for each segment is done with a representative or averaged value of the amount to obtain a corrected position value in the respective segment.

8. Method according to claim 7, wherein the auxiliary points of a segment are spaced at uniform distance along the pattern element boundary.

9. Method according to claim 7, wherein the auxiliary points of a segment are spaced at varying distances along the pattern element boundary, the distances being chosen decrementing with incrementing variation of said non-linear function.

10. Method for exposing a pattern on a target by means of a charged-particle multi-beam writing apparatus, said apparatus exposing a multitude of pixels (px) within an exposure region (r1) on the target to generate said pattern by means of a scanning stripe exposure, the method including:

providing the pattern to a processing system associated with said apparatus, the pattern being realized as a pixel graphic composed of a plurality of pixels defined in accordance with a raster grid on the exposure region (r1), wherein each of said pixels is represented by a geometric pixel shape located at a respective pixel position and is assigned an intensity value corresponding to a value of exposure dose to be exposed for the respective pixel;

calculating, in said processing system, a corrected pattern by applying the method of any one of the preceding claims to said pattern; and performing an exposure process according to the corrected pattern in said apparatus.

* * * * *